United States Patent
Rana et al.

(10) Patent No.: US 9,419,165 B2
(45) Date of Patent: *Aug. 16, 2016

(54) LASER PROCESSING FOR HIGH-EFFICIENCY THIN CRYSTALLINE SILICON SOLAR CELL FABRICATION

(71) Applicant: Solexel, Inc., Milpitas, CA (US)

(72) Inventors: Virendra V. Rana, Los Gatos, CA (US); JianJun Liang, Milpitas, CA (US); Pranav Anbalagan, San Jose, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/846,230

(22) Filed: Mar. 18, 2013

(65) Prior Publication Data
US 2013/0217172 A1    Aug. 22, 2013

Related U.S. Application Data

(63) Continuation of application No. 13/118,295, filed on May 27, 2011, now Pat. No. 8,399,331, and a continuation-in-part of application No. 11/868,488, filed on Oct. 6, 2007, now Pat. No. 8,129,822, and a (Continued)

(51) Int. Cl.
*H01L 31/068* (2012.01)
*H01L 31/18* (2006.01)
(Continued)

(52) U.S. Cl.
CPC .......... *H01L 31/18* (2013.01); *H01L 31/02363* (2013.01); *H01L 31/022441* (2013.01);
(Continued)

(58) Field of Classification Search
CPC ................................................ H01L 21/02612
See application file for complete search history.

(56) References Cited

U.S. PATENT DOCUMENTS

| 4,800,179 A | 1/1989 | Mukai |
| 5,011,565 A | 4/1991 | Dube et al. |

(Continued)

FOREIGN PATENT DOCUMENTS

| DE | 10 2009 018112 B3 | 12/2010 |
| KR | 10-2009-0025998 | 3/2009 |

(Continued)

OTHER PUBLICATIONS

PCT International Search Report and Written Opinion dated Feb. 9, 2012 issued in PCT/US2011/038444.

(Continued)

*Primary Examiner* — Cheung Lee
(74) *Attorney, Agent, or Firm* — John Wood

(57) ABSTRACT

A method for making a back contact solar cell. Base isolation regions are formed in a crystalline silicon back contact solar cell substrate having a substrate thickness in the range of approximately 1 micron to 100 microns. Pulsed laser ablation of a substance on the crystalline silicon back contact solar cell substrate is performed to form base openings, wherein the substance is at least one of silicon oxide, silicon nitride, aluminum oxide, silicon oxynitride, or silicon carbide. Emitter regions are selectively doped and base regions are selectively doped. Contact openings are formed for the selectively doped base regions and the selectively doped emitter regions. Metallization is formed on the selectively doped base regions and the selectively doped emitter regions.

19 Claims, 27 Drawing Sheets

Related U.S. Application Data continuation-in-part of application No. 11/868,492, filed on Oct. 6, 2007, now abandoned, and a continuation-in-part of application No. 12/774,713, filed on May 5, 2010, now Pat. No. 8,420,435, and a continuation-in-part of application No. 13/057,104, filed as application No. PCT/US2010/059759 on Dec. 9, 2010, now Pat. No. 8,962,380.

(60) Provisional application No. 61/349,120, filed on May 27, 2010, provisional application No. 60/828,678, filed on Oct. 9, 2006, provisional application No. 60/886,303, filed on Jan. 24, 2007, provisional application No. 61/175,698, filed on May 5, 2009, provisional application No. 61/285,140, filed on Dec. 9, 2009.

(51) Int. Cl.
*H01L 31/0224* (2006.01)
*H01L 31/0236* (2006.01)
*H01L 31/0352* (2006.01)
*H01L 31/05* (2014.01)
*H01L 31/0747* (2012.01)
*H01L 31/056* (2014.01)

(52) U.S. Cl.
CPC .... *H01L31/035281* (2013.01); *H01L 31/0516* (2013.01); *H01L 31/0682* (2013.01); *H01L 31/0747* (2013.01); *H01L 31/1804* (2013.01); *H01L 31/1884* (2013.01); *H01L 31/1896* (2013.01); *H01L 31/056* (2014.12); *Y02E 10/547* (2013.01); *Y02P 70/521* (2015.11)

(56) References Cited

U.S. PATENT DOCUMENTS

| | | | |
|---|---|---|---|
| 5,348,589 A | 9/1994 | Arai et al. | |
| 5,538,564 A | 7/1996 | Kaschmitter | |
| 5,641,362 A | 6/1997 | Meier | |
| 5,928,438 A | 7/1999 | Salami et al. | |
| 5,989,977 A | 11/1999 | Wu et al. | |
| 6,429,037 B1 | 8/2002 | Wenham et al. | |
| 6,534,336 B1 | 3/2003 | Iwane et al. | |
| 6,645,833 B2 | 11/2003 | Brendel | |
| 6,982,218 B2 | 1/2006 | Preu et al. | |
| 7,057,256 B2 | 6/2006 | Carey, III et al. | |
| 7,517,709 B1 | 4/2009 | Borden | |
| 7,857,907 B2 | 12/2010 | Cho et al. | |
| 8,399,331 B2 * | 3/2013 | Moslehi et al. | 438/329 |
| 8,409,976 B2 | 4/2013 | Hieslmair | |
| 8,637,340 B2 | 1/2014 | Moslehi et al. | |
| 2003/0017712 A1 | 1/2003 | Brendel | |
| 2004/0042080 A1 | 3/2004 | Caudle et al. | |
| 2004/0200520 A1 | 10/2004 | Mulligan et al. | |
| 2004/0261834 A1 | 12/2004 | Basore et al. | |
| 2005/0172996 A1 | 8/2005 | Hacke et al. | |
| 2006/0009008 A1 | 1/2006 | Kaneuchi et al. | |
| 2006/0060238 A1 | 3/2006 | Hacke et al. | |
| 2006/0088984 A1 | 4/2006 | Li et al. | |
| 2006/0130891 A1 | 6/2006 | Carlson | |
| 2006/0228897 A1 | 10/2006 | Timans | |
| 2007/0137692 A1 | 6/2007 | Carlson | |
| 2007/0151598 A1 | 7/2007 | De Ceuster et al. | |
| 2007/0157965 A1 | 7/2007 | Park et al. | |
| 2007/0256728 A1 | 11/2007 | Cousins | |
| 2008/0132054 A1 | 6/2008 | Ribeyron et al. | |
| 2008/0202576 A1 | 8/2008 | Hieslmair | |
| 2008/0202577 A1 | 8/2008 | Hieslmair | |
| 2009/0301557 A1 | 12/2009 | Agostinelli et al. | |
| 2010/0051085 A1 | 3/2010 | Weidman et al. | |
| 2010/0055822 A1 | 3/2010 | Weidman et al. | |
| 2010/0059109 A1 | 3/2010 | Nakayashiki et al. | |
| 2010/0108130 A1 | 5/2010 | Ravi | |
| 2010/0144079 A1 | 6/2010 | Mayer et al. | |
| 2010/0148318 A1 | 6/2010 | Wang et al. | |
| 2010/0224229 A1 | 9/2010 | Pralle et al. | |
| 2010/0240172 A1 | 9/2010 | Rana et al. | |
| 2010/0243040 A1 | 9/2010 | Kim | |
| 2010/0304521 A1 | 12/2010 | Seutter et al. | |
| 2011/0265864 A1 | 11/2011 | Kim et al. | |
| 2012/0028399 A1 | 2/2012 | Moslehi et al. | |
| 2012/0055541 A1 | 3/2012 | Granek et al. | |
| 2012/0122272 A1 | 5/2012 | Rana et al. | |
| 2012/0178203 A1 | 7/2012 | Moslehi et al. | |
| 2012/0225515 A1 | 9/2012 | Moslehi et al. | |
| 2013/0130430 A1 | 5/2013 | Moslehi et al. | |
| 2013/0164883 A1 | 6/2013 | Moslehi et al. | |
| 2014/0017846 A1 | 1/2014 | Moslehi et cd. | |
| 2014/0158193 A1 | 6/2014 | Desphande et al. | |
| 2014/0370650 A1 | 12/2014 | Moslehi et cd. | |
| 2015/0054903 A1 | 2/2015 | Liu | |
| 2015/0140721 A1 | 5/2015 | Moslehi et al. | |

FOREIGN PATENT DOCUMENTS

| | | |
|---|---|---|
| KR | 10-2010-0085736 | 7/2010 |
| KR | 10-2010-0096819 | 9/2010 |
| KR | 10-2010-0102255 | 9/2010 |
| KR | 10-2010-0107258 | 10/2010 |
| KR | 10-2010-0128132 | 12/2010 |
| KR | 10-1023144 | 3/2011 |
| KR | 10-2011-0122214 | 11/2011 |
| KR | 10-2011-0129084 | 12/2011 |
| WO | WO/2008/156631 | 12/2008 |
| WO | WO/2010/057060 | 5/2010 |
| WO | WO/2010/091466 | 8/2010 |
| WO | WO/2010/135153 | 11/2010 |
| WO | WO/2011/072153 | 6/2011 |
| WO | WO/2011/150397 | 12/2011 |
| WO | WO/2012/092537 | 7/2012 |
| WO | WO/2012/162276 | 11/2012 |

OTHER PUBLICATIONS

PCT International Preliminary Report on Patentability dated Nov. 27, 2012 issued in PCT/US2011/038444.

EP Extended Search Report dated Mar. 6, 2014 issued in EP 11787543.5.

Grohe et al. (2009) "Novel laser technologies for crystalline silicon solar cell production" Proceedings of SPIE, 7202: 72020P (1-12) DOI: 10.1117/12.810128.

Hermann et al. (Nov. 7, 2009) "Picosecond laser ablation of Si02 layers on silicon substrates" Applied Physics A; Materials Science & Processing, 99(1): 151-158.

Mangersnes et al. (Feb. 23, 2010) "Damage free laser ablation of Si02 for local contact opening on silicon solar cells using an a-Si: H buffer layer" Journal of Applied Physics, 107(4): 43518 (1-6).

Palani et al. (2010) "Investigation on Laser-annealing and Subsequent Laser-nanotexturing of Amorphous Silicon (a-Si) Films for Photovoltaic Application" *JLMN-Journal of Laser Micro/Nanoengineering*, 5(2): 150-155.

* cited by examiner

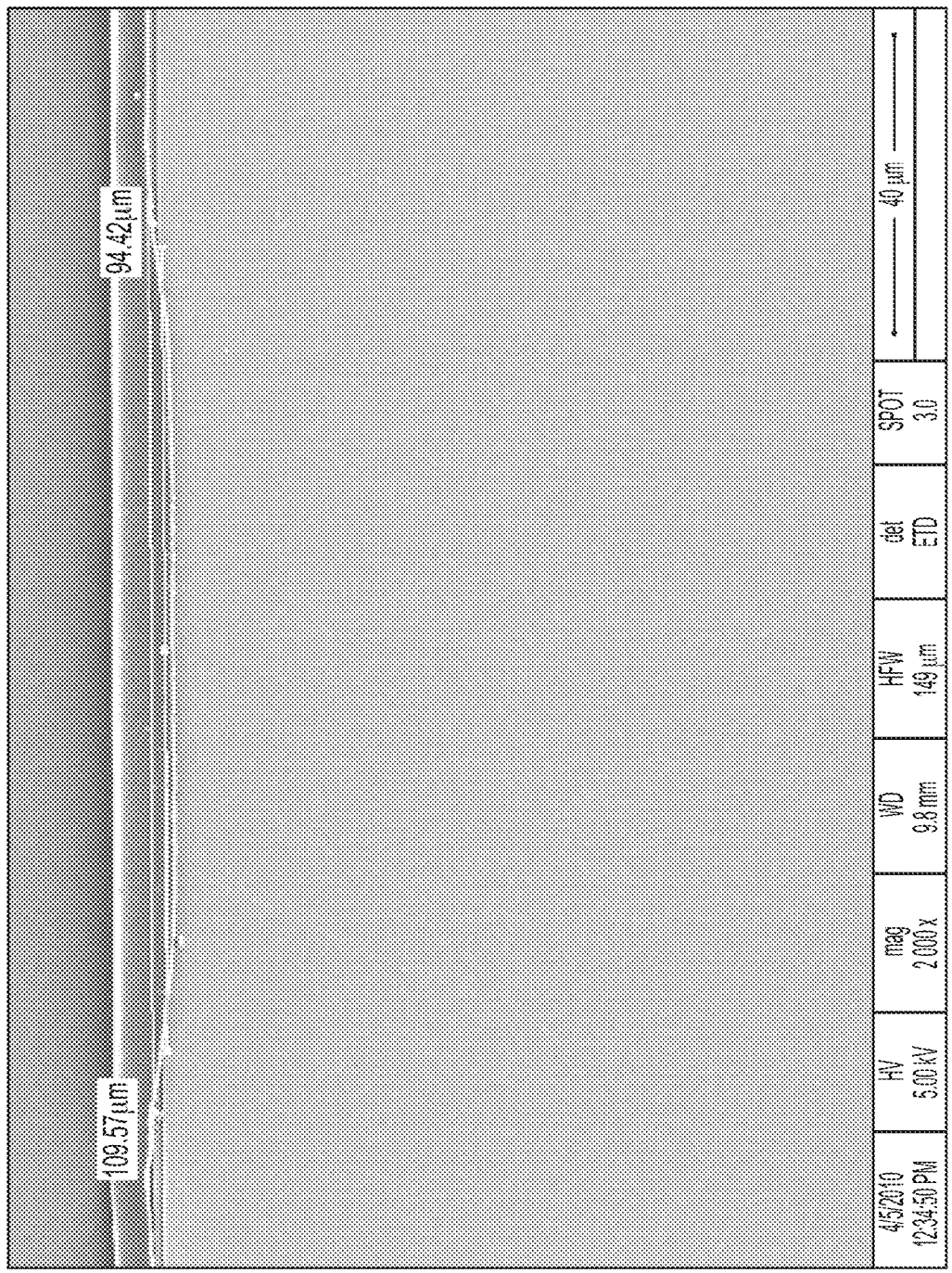
FIG. 1 (photograph)

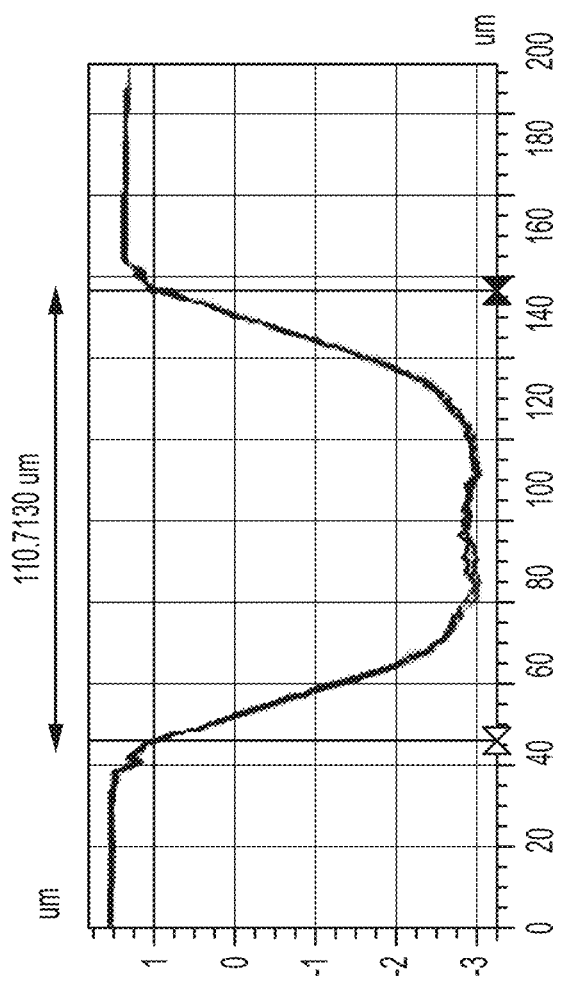
FIG. 2 (screenshot)

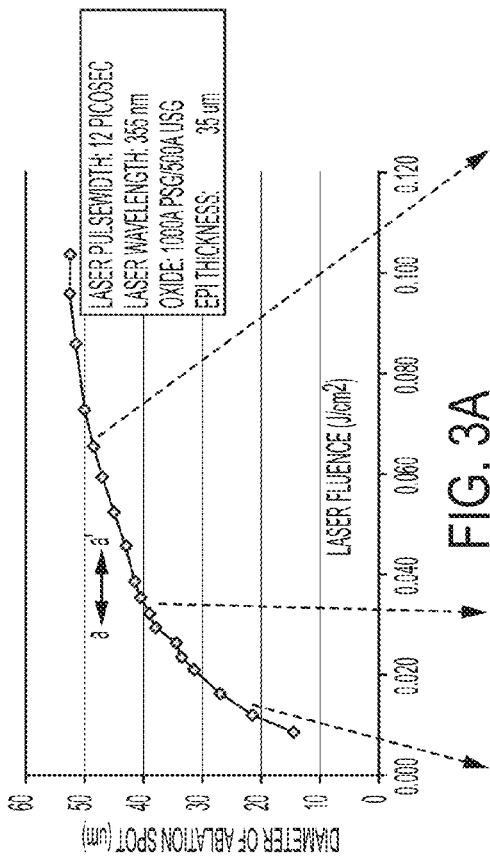
FIG. 3A
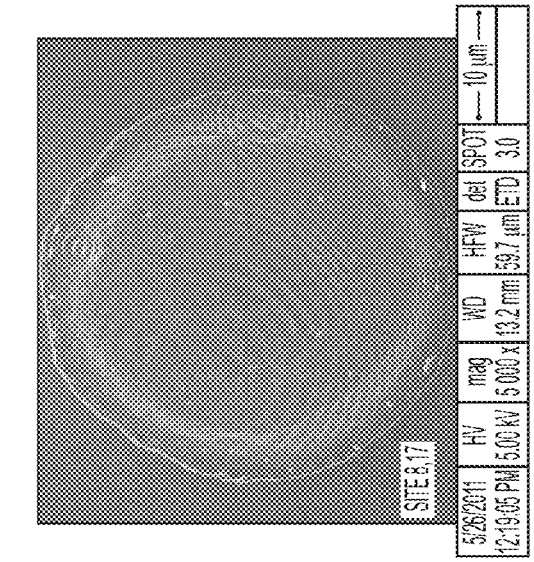
FIG. 3D (photograph)
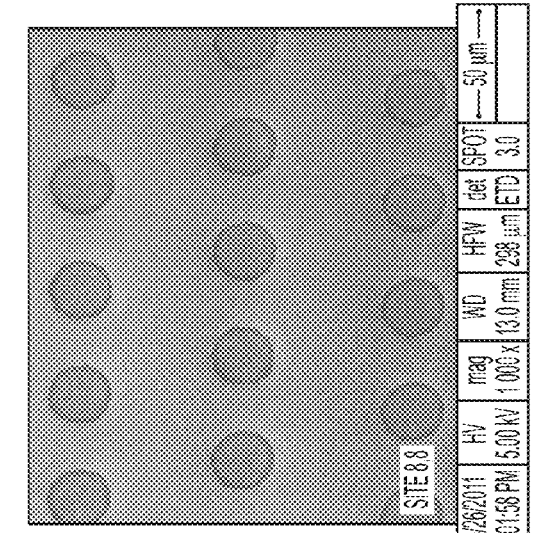
FIG. 3C (photograph)
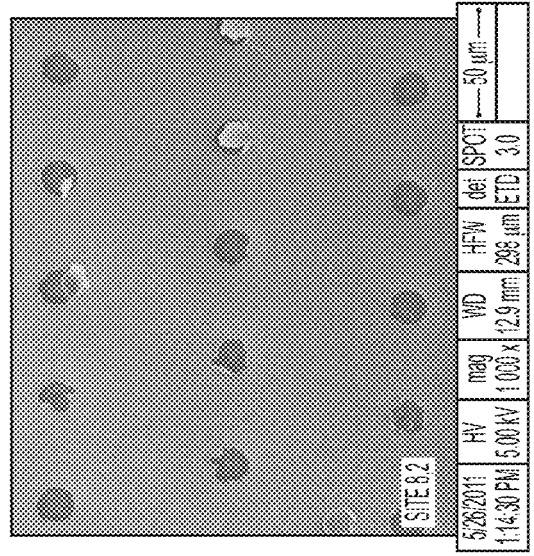
FIG. 3B (photograph)

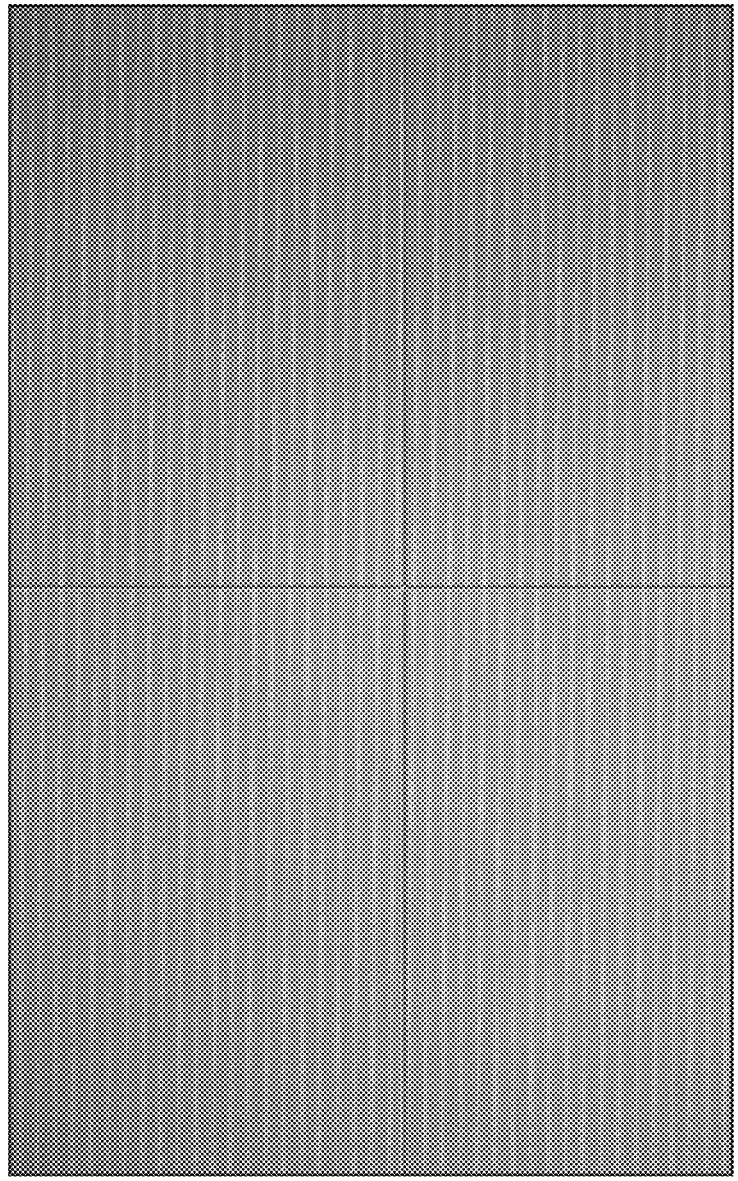
FIG. 4 (photograph)

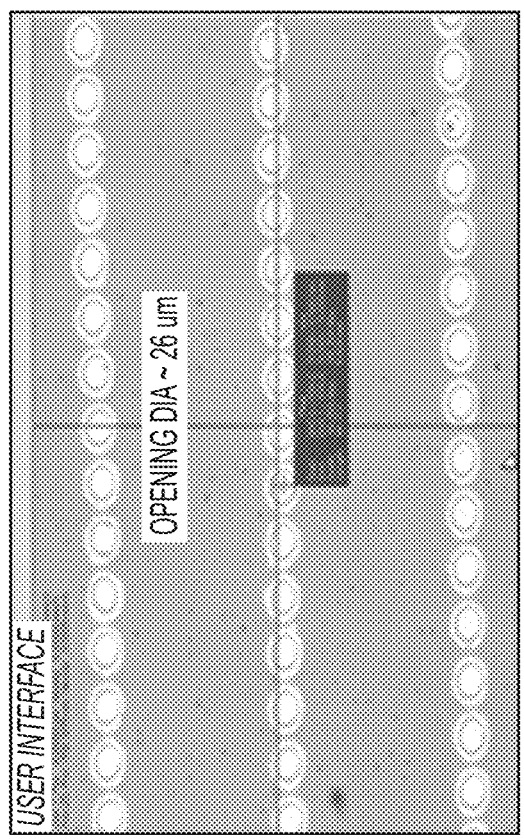
FIG. 5 (screenshot)

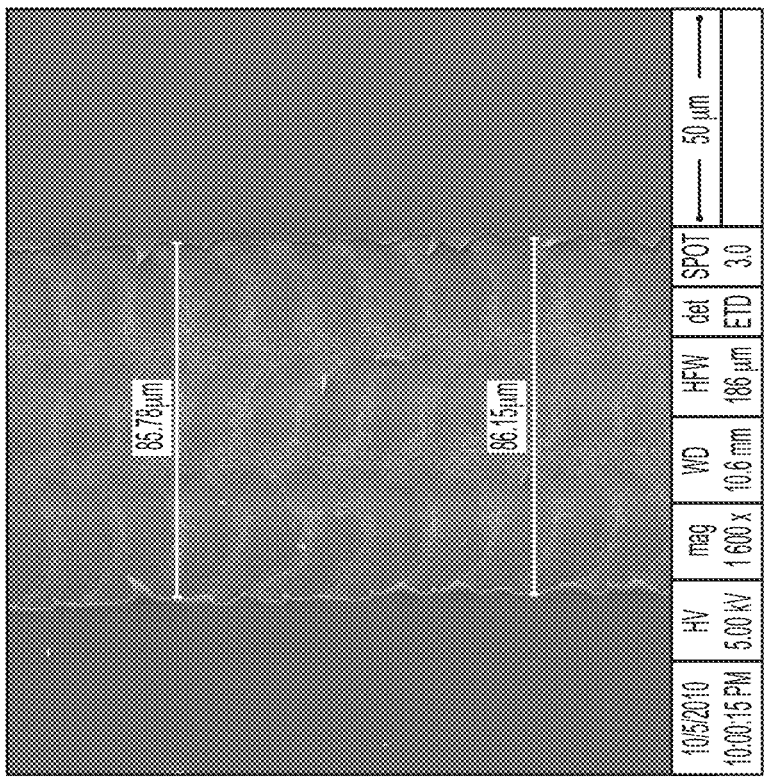
FIG. 6B (photograph)
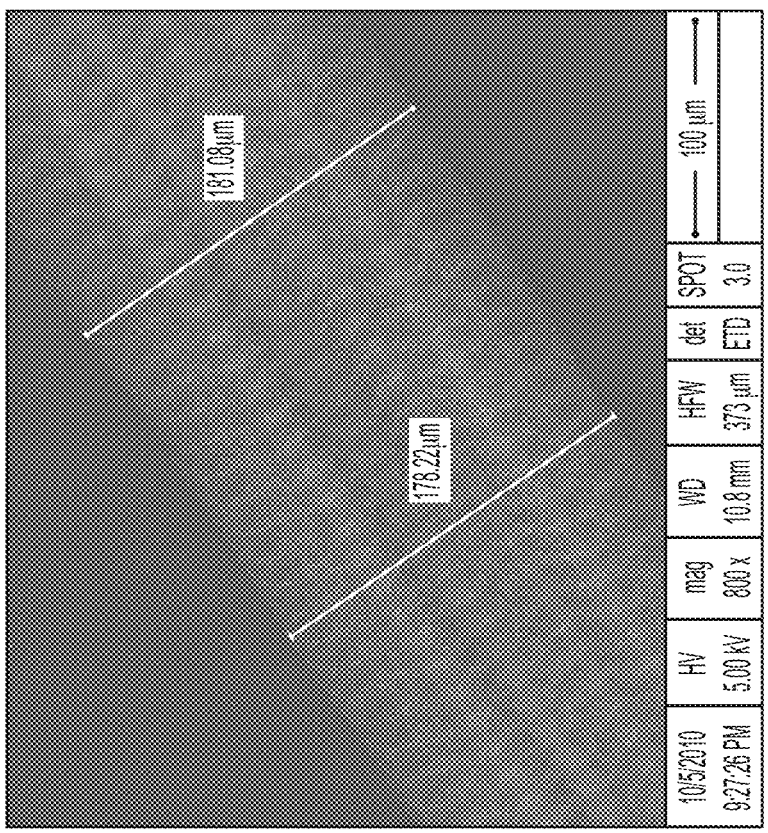
FIG. 6A (photograph)

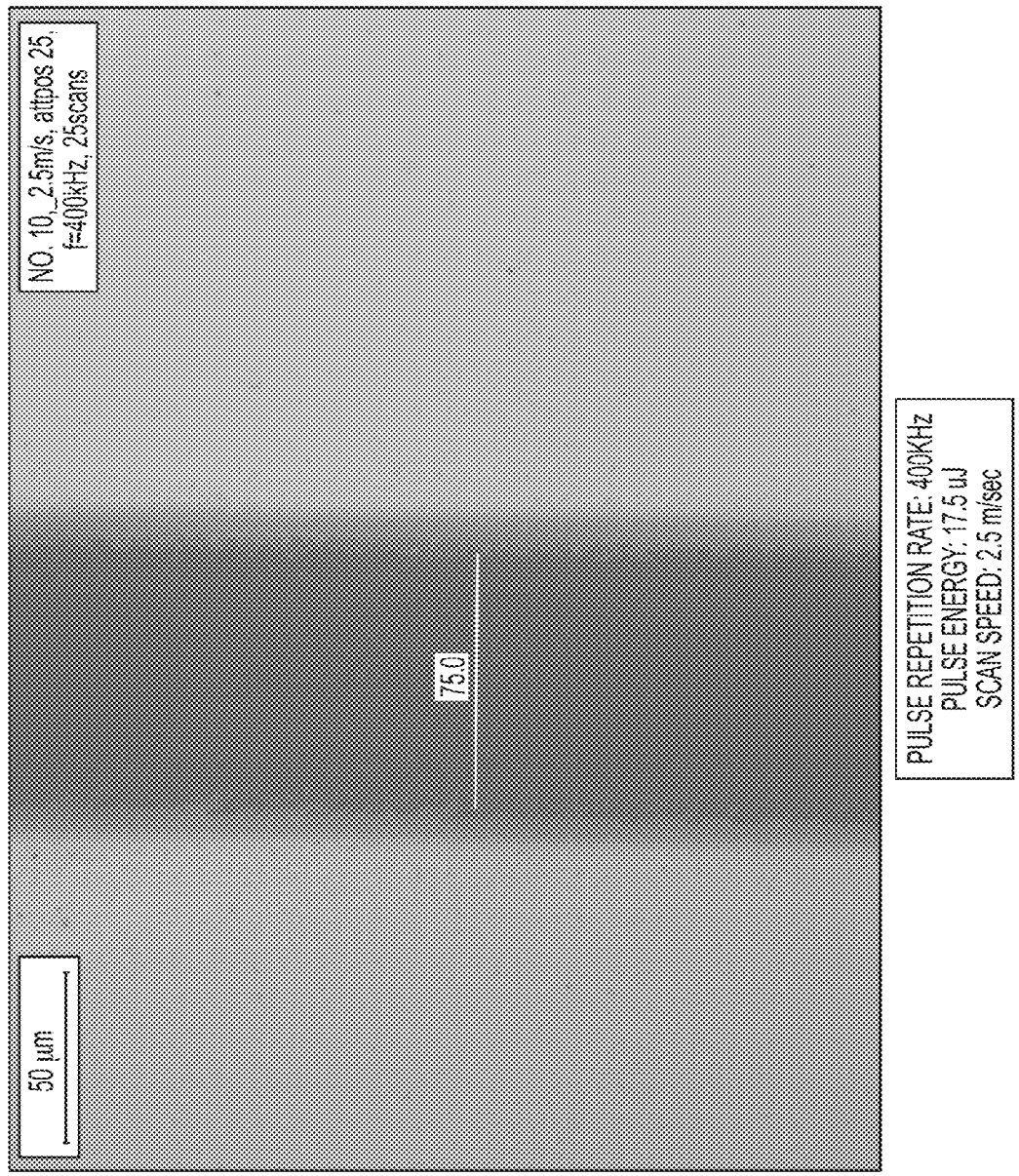
FIG. 7C (photograph)

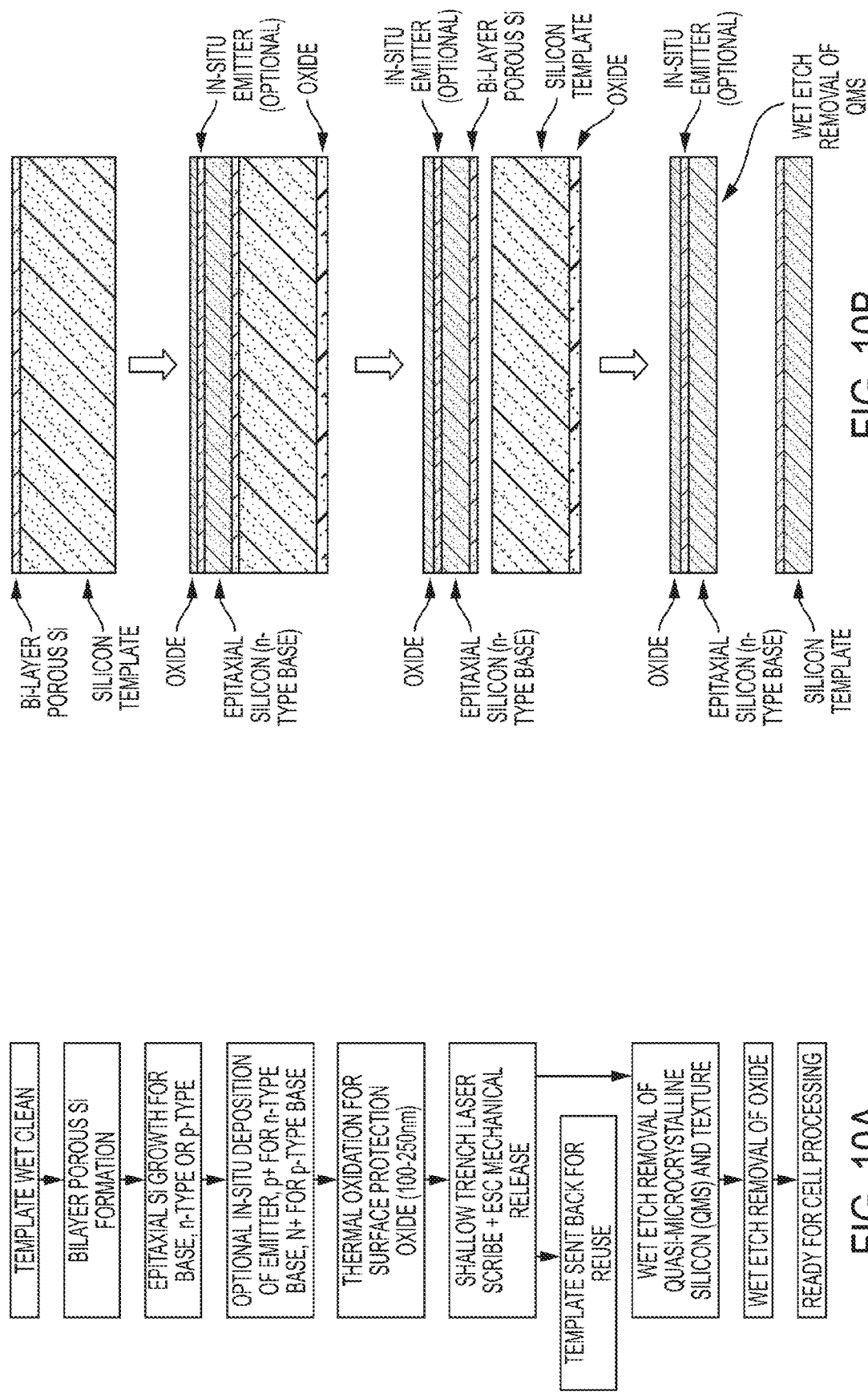

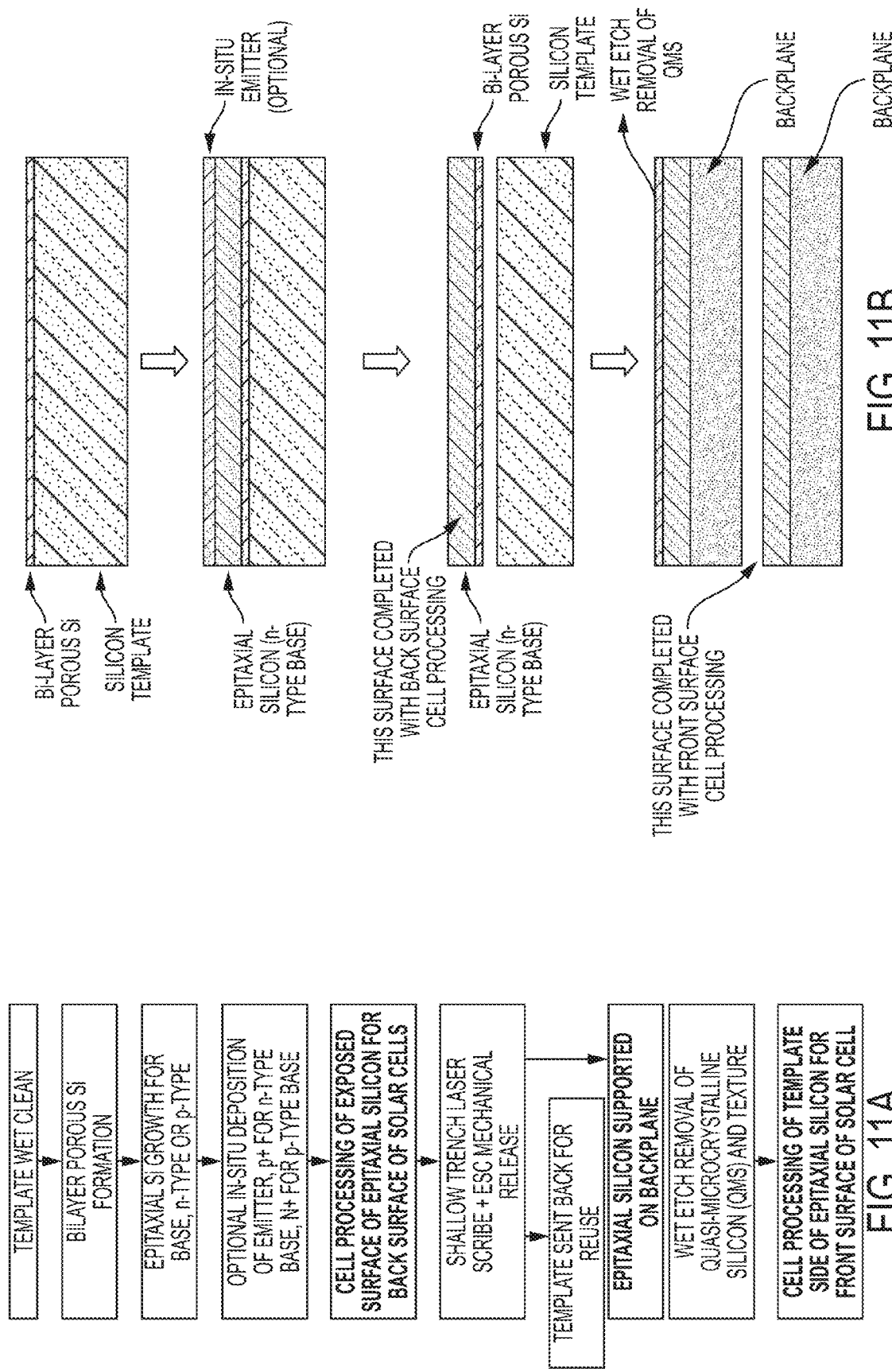

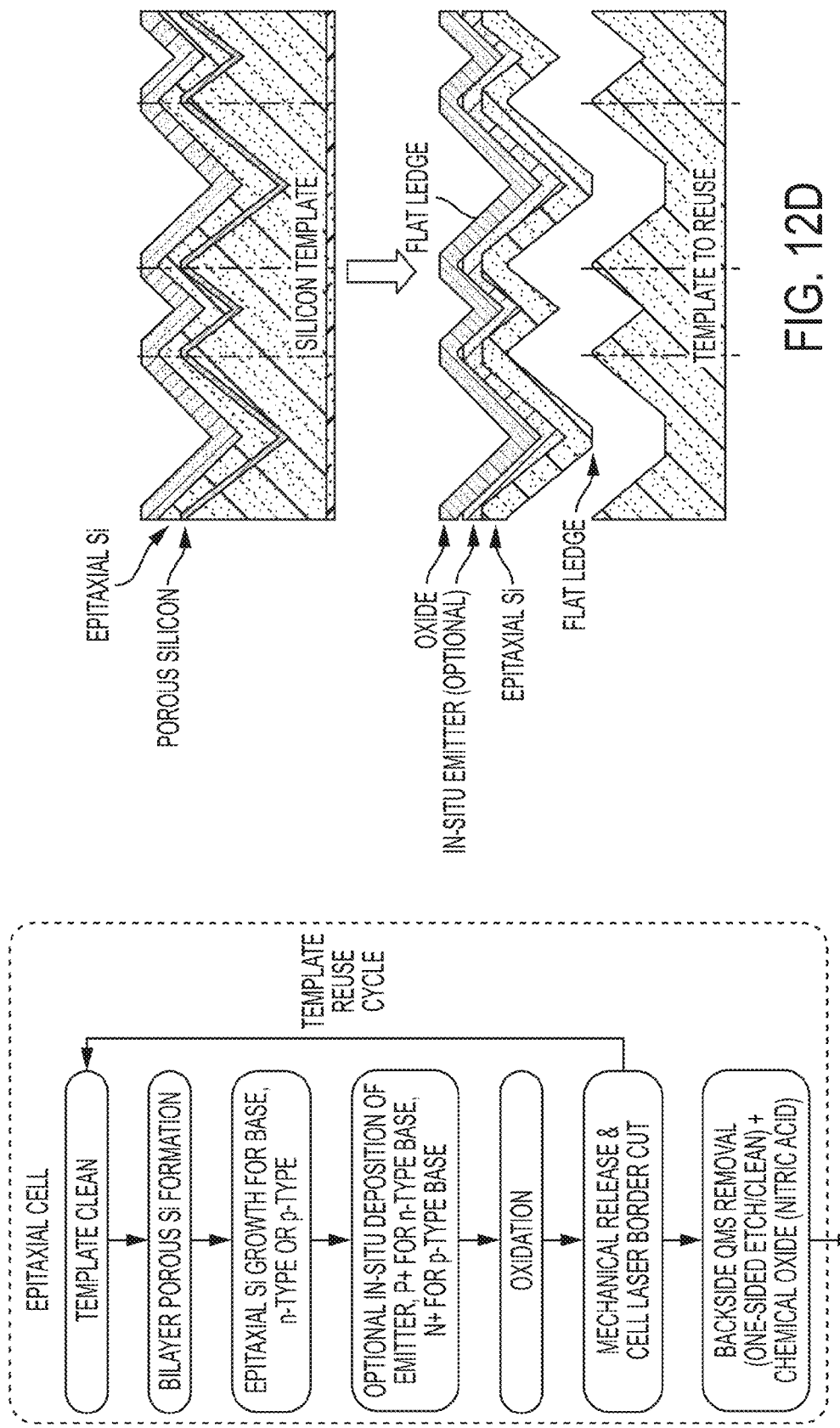

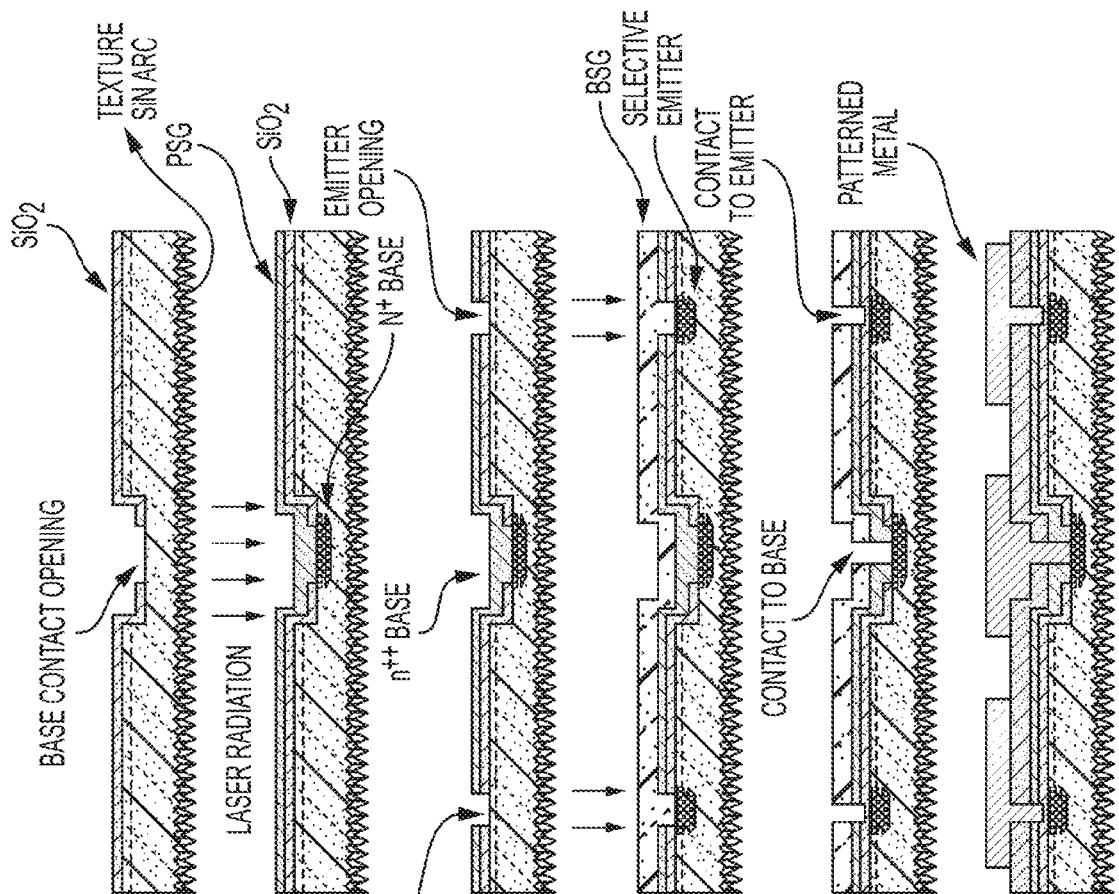

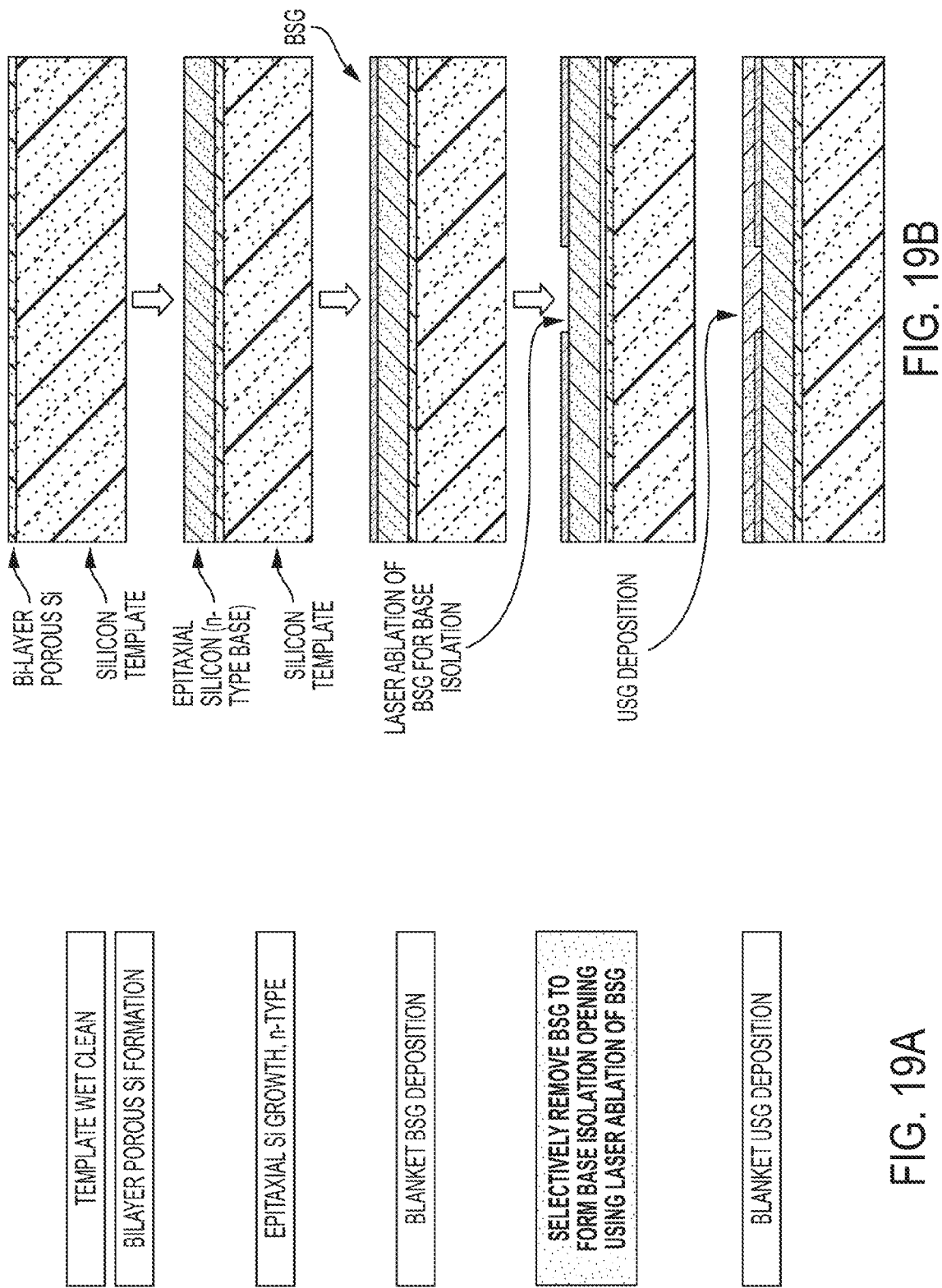

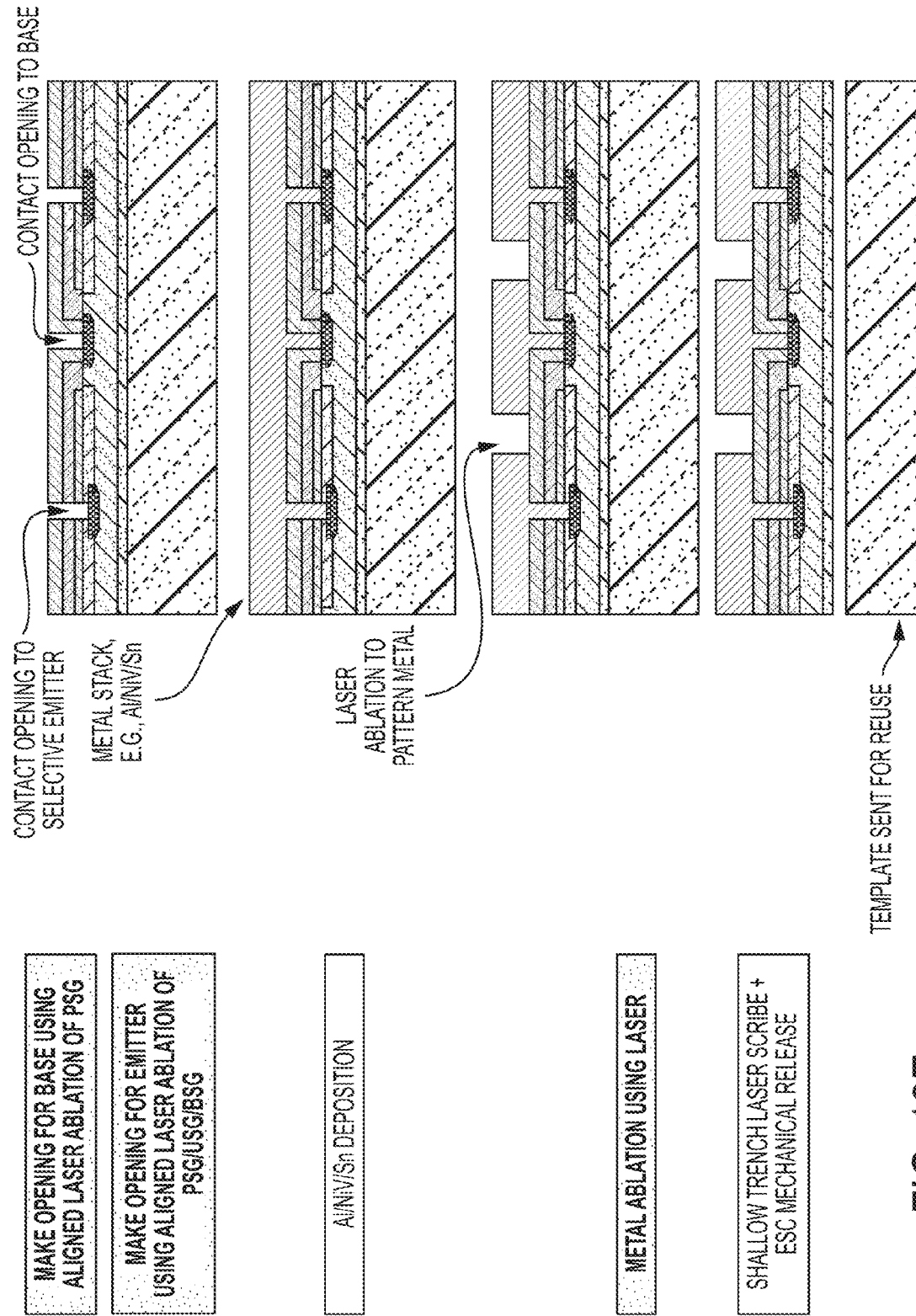

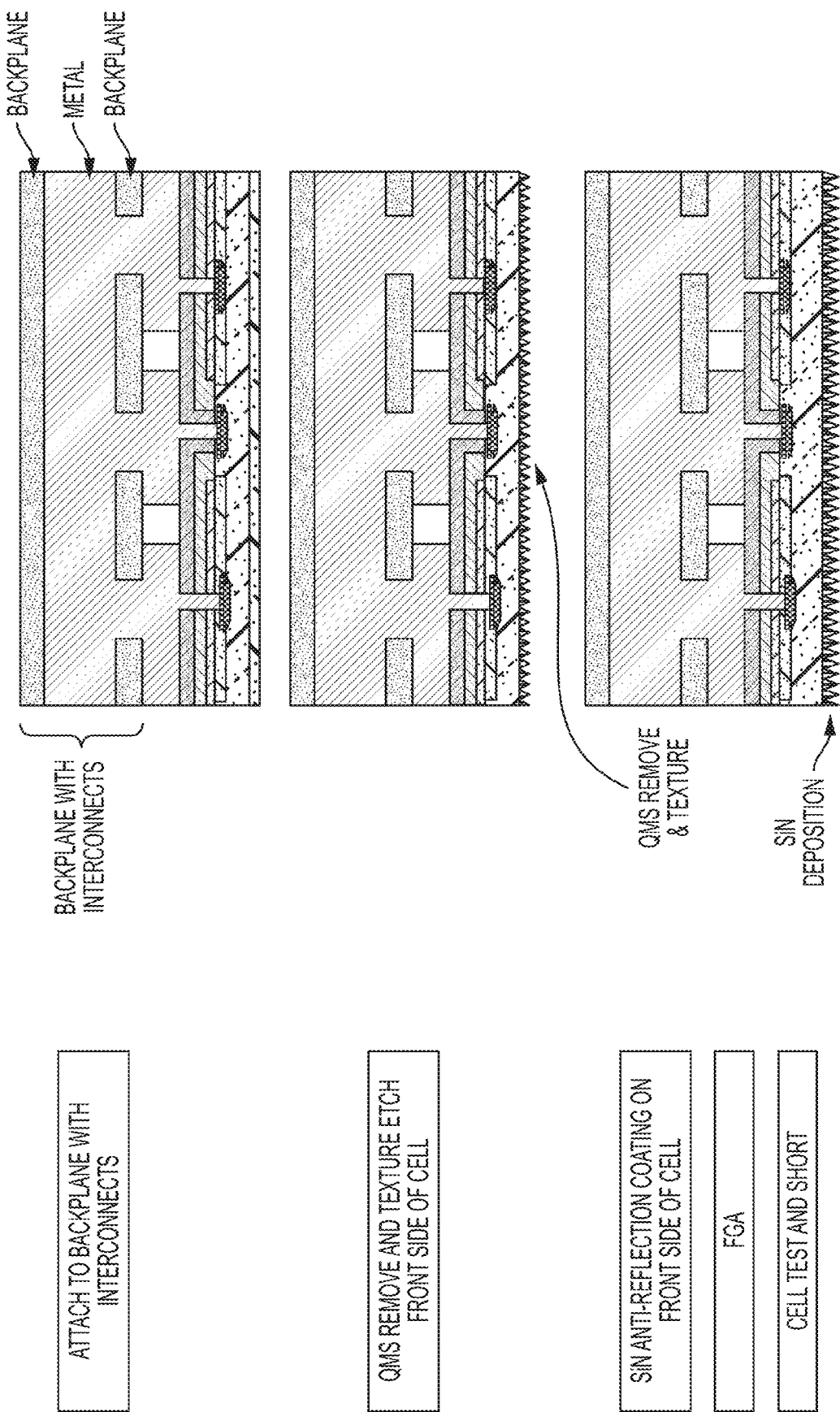

LASER PROCESSING FOR HIGH-EFFICIENCY THIN CRYSTALLINE SILICON SOLAR CELL FABRICATION

CROSS-REFERENCE TO RELATED APPLICATIONS

This application is a continuation of U.S. patent application Ser. No. 13/118,295 filed May 27, 2011 which claims priority to U.S. Provisional Patent Application No. 61/349,120 filed May 27, 2010, all of which are hereby incorporated by reference in their entirety. U.S. patent application Ser. No. 13/118,295 is a continuation-in-part of U.S. patent application Ser. No. 11/868,488 filed Oct. 6, 2007 which claims priority to U.S. Provisional Patent Application Nos. 60/886,303 filed Jan. 24, 2007 and 60/828,678 filed Oct. 9, 2006 and also a continuation-in-part of U.S. patent application Ser. No. 11/868,492 filed Oct. 6, 2007 which claims priority to U.S. Provisional Patent Application Nos. 60/886,303 filed Jan. 24, 2007 and 60/828,678 filed Oct. 9, 2006 and also a continuation-in-part of U.S. patent application Ser. No. 12/774,713 filed May 5, 2010 which claims priority to U.S. Provisional Patent Application No. 61/175,698 filed May 5, 2009 and U.S. patent application Ser. No. 13/057,104 filed Feb. 1, 2011 which is a U.S. National Stage of International Application No. PCT/US2010/059759, filed Dec. 9, 2010, which claims priority to U.S. Provisional Patent Application No. 61/285,140 filed Dec. 9, 2009, all of which are hereby incorporated by reference in their entirety.

FIELD

This disclosure relates in general to the field of solar photovoltaics, and more particularly to laser processing techniques for the production of crystalline semiconductor, including crystalline silicon, and other types of photovoltaic solar cells.

BACKGROUND

Laser processing offers several advantages in terms of efficiency enhancement and manufacturing cost reduction for high-performance, high-efficiency solar cell processing. Firstly, advanced crystalline silicon solar cells may benefit from having the dimensions of the critical features such as electrical contacts be much smaller than the current industrial practice. For front contacted solar cells the contact area of the front metallization to the emitter as well as the contact area of the back metal to the base needs to be low (or the contact area ratios should be fairly small, preferably much below 10%). For an all back-contact, back-junction solar cell, where the emitter and base regions forming the p/n junction and the metallization are on the same side (the cell backside opposite the sunny side), the dimensions of the various features are typically small for high efficiency. In these cells where typically the emitter and base regions form alternate stripes, the width of these regions (in particular the width of the base contact) tends to be small. Also, the dimensions of the metal contacts to these regions tend to be proportionally small. The metallization connecting to the emitter and base regions then needs to be patterned to a correspondingly finer scale. Generally, lithography and laser processing are the technologies that have the relatively fine resolution capability to provide the small dimensions and the control required. Of these techniques, only laser processing offers the low cost advantage required in solar cell making. While lithography requires consumables such as photoresist and subsequent resist developer and stripper (which add to the process cost and complexity), laser processing is a non-contact, dry, direct write method and does not require any material consumables, making it a simpler and lower cost process for solar cell fabrication. Moreover, laser processing is an excellent choice for environmentally benign manufacturing since it is an all-dry process which does not use any consumables such as chemicals.

Further, to reduce the cost of solar cells there is a push to reduce the thickness of the crystalline silicon used and also at the same time increase the cell area for more power per cell and lower manufacturing cost per watt. Laser processing is suitable for these thin wafers and thin-film cell substrates as it is a completely non-contact, dry process and can be easily scaled to larger cell sizes.

Laser processing is also attractive as it is generally a "green" and environmentally benign process, not requiring or using poisonous chemicals or gases. With suitable selection of the laser and the processing system, laser processing presents the possibility of very high productivity with a very low cost of ownership.

Despite these advantages, the use of laser processing in crystalline silicon solar cell making has been limited because laser processes that provide high performance cells have not been developed. Disclosed here are laser processes using schemes that are tailored for each key application to produce solar cells with high efficiency. Specific embodiments are also disclosed for applications of laser processing in manufacturing thin-film crystalline silicon solar cells, such as those manufactured using sub-50-micron silicon substrates formed by epitaxial silicon growth.

SUMMARY

According to one aspect of the disclosed subject matter, a method for making a back contact solar cell is provided. Base isolation regions are formed in a crystalline silicon back contact solar cell substrate having a substrate thickness in the range of approximately 1 micron to 100 microns. Pulsed laser ablation of a substance on the crystalline silicon back contact solar cell substrate is performed to form base openings, wherein the substance is at least one of silicon oxide, silicon nitride, aluminum oxide, silicon oxynitride, or silicon carbide. Emitter regions are selectively doped and base regions are selectively doped. Contact openings are formed for the selectively doped base regions and the selectively doped emitter regions. Metallization is formed on the selectively doped base regions and the selectively doped emitter regions.

According to one embodiment, the step of performing pulsed laser ablation is carried out using a picoseconds pulse UV laser. According to one embodiment, the step of forming base isolation regions in the crystalline silicon back contact solar cell substrate is carried out via a laser silicon ablation process and using a pulsed laser having a wavelength of approximately 800 nm or less and a pulse width less than approximately 100 picoseconds. According to one embodiment, the step of forming base isolation regions in the crystalline silicon back contact solar cell substrate is carried out via pulsed laser ablation of a deposited borosilicate glass layer.

BRIEF DESCRIPTION OF THE DRAWINGS

The features, nature, and advantages of the disclosed subject matter will become more apparent from the detailed description set forth below when taken in conjunction with the drawings, in which like reference numerals indicate like features and wherein:

FIG. 1 shows a scanning electron microscope (SEM) image of a shallow trench made in silicon for application in an all back contact solar cell, in accordance with the present disclosure;

FIG. 2 shows a profile of a shallow trench in silicon for application in all back contact solar cells;

FIGS. 3A-3D show the procedure for selecting the laser fluence to obtain damage-free silicon dioxide (or oxide) ablation. FIG. 3A shows the dependence of the size of the ablation spot on the laser fluence; FIG. 3B shows irregular delamination of oxide; FIG. 3C shows a damage-free spot; and FIG. 3D shows highly damaged silicon in the spot opening;

FIG. 4 shows substantially parallel rows of contacts opened in oxide using pulsed laser ablation in accordance with the present disclosure;

FIG. 5 shows a screenshot with oxide ablation spots for metal contacts;

FIGS. 6A and 6B show the laser-ablated area formed by making ablation spots that are overlapped in both the x and y-direction; FIG. 6A shows a 18 micron wide strip opened in 1000 A BSG (boron-doped oxide)/500 A USG (undoped oxide) for base isolation region; and FIG. 6B shows a 90 micron wide stripe opened in 1000 A USG (undoped oxide) for base region;

FIG. 7C shows an optical micrograph of the trench formed in this metal stack;

FIGS. 10A and 10B show a process flow for creation and release of a planar epitaxial thin film silicon solar cell substrate (TFSS);

FIGS. 11A and 11B show a process flow for planar epitaxial thin film silicon solar cell substrate in case the TFSS is too thin to be free standing or self-supporting;

FIGS. 12C and 12D show a process flow for 3-D TFSS creation using the reusable micromold template;

FIGS. 16A-16D show a process flow for making an interdigitated back contact back-junction solar cell where the TFSS is thick enough to be self supporting, in accordance with the present disclosure;

FIGS. 19A-19H show a process flow for making an interdigitated back-contact back-junction solar cell where the TFSS is not thick enough to be self supporting, and where instead of in-situ emitter BSG (boron-doped oxide) deposition and selective laser etchback is used to form the base isolation opening, in accordance with the present disclosure;

DETAILED DESCRIPTION

Figure 7A:
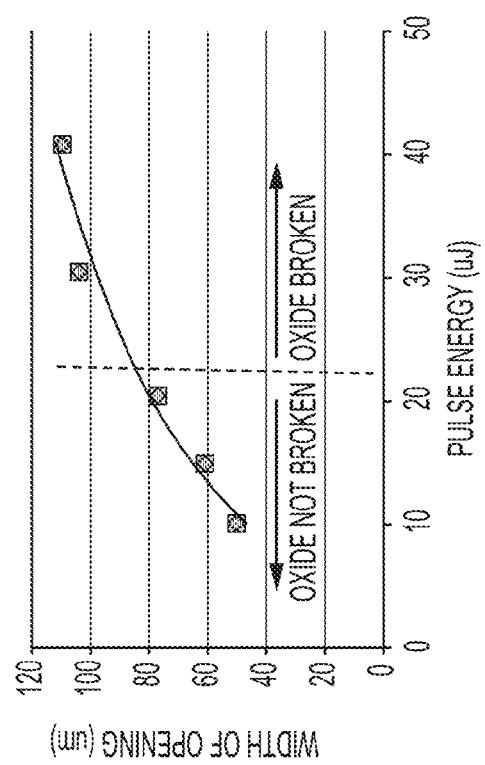
FIG. 7A shows the threshold for oxide damage, below which metal can be removed without metal penetration of the oxide layer.

Although the present disclosure is described with reference to specific embodiments, one skilled in the art could apply the principles discussed herein to other areas and/or embodiments without undue experimentation.

We present here laser processing, more specifically pulsed laser processing, schemes that have been developed to address the varying requirements of different processes.

The disclosed methods may be useful in the area of semiconductor device ablation, particularly crystalline silicon ablation. Typically removal of silicon with a laser involves silicon melting and evaporation that leaves undesirable residual damage in the silicon substrate. This damage causes minority carrier lifetime degradation and increased surface recombination velocity (SRV) that reduces the solar cell efficiency. Hence, wet cleaning of the silicon substrate is typically used to remove this damage layer. We present a scheme to reduce this damage to a level acceptable for high efficiency solar cell manufacturing that does not require post-laser-processing wet cleaning, hence simplifying the process flow and reducing the manufacturing cost.

The damage remaining in the silicon substrate upon ablating a certain thickness of it using a laser is related to the amount of laser energy absorbed in the substrate that is not used by the ablated material. If it can be managed that most of the laser energy is used in removing the material then the fraction of the incident energy that seeps into the silicon substrate is minimized, thus minimizing the laser-induced substrate damage and SRV degradation. The penetration of laser energy into silicon depends on the laser pulse length (also called pulse width) and wavelength. The infrared (IR) laser beam, wavelength 1.06 microns, has a long penetration depth in silicon, up to about 1000 microns, while green laser beam, with a wavelength of 532 nm, penetrates only to a depth of approximately 3 to 4 microns. The penetration of UV laser beam, with a wavelength of 355 nm, is even shorter, only about 10 nm. It is clear that using ultra-short pulses of UV or EUV wavelength limits the penetration of the laser energy into silicon. Additionally, shorter laser pulse length results in shorter diffusion of heat into silicon. While a nanoseconds pulse can lead to heat diffusion in silicon to approximately 3 to 4 microns range, the picoseconds pulse reduces it to about 80 to 100 nm, while a femtoseconds pulse is so short that typically there is no heat diffusion into silicon during the laser ablation process. Hence going to shorter pulses with a shorter wavelength lead to diminishing damage to the laser-ablated substrate. For higher production throughput, green or IR wavelengths can be used depending on the extent of laser damage acceptable. Since even under ideal conditions a certain fraction of the energy would still seep into the substrate, this absorption and its undesirable side effects can be further reduced by reducing the laser power. However, this results in a smaller thickness of silicon being ablated (or a lower silicon ablation rate or lower throughput). It has been found that reducing the pulse energy but causing the silicon removal by increasing the overlap of the laser pulses makes the silicon shallow isolation trench smoother. This is an indication of low silicon surface damage. At very low pulse energies the thickness of silicon removed may be small. The desired depth may then be obtained by using multiple overlapped scans of the pulsed laser beam.

A pulsed laser beam with pulse length in the picoseconds range and a wavelength of approximately 355 nm or below is suitable for silicon ablation with low damage enabling low surface recombination velocity (SRV) for passivated ablated surfaces. FIG. 1 shows a 2.25 micron deep and nearly 100 micron wide trench made in a silicon substrate using a picoseconds UV laser beam of Gaussian profile ($M^2<1.3$), nearly 110 microns in diameter with 4 microjoule pulse energy, the laser spots overlapped nearly 15 times. This depth of ablation was obtained using twenty overlapped scans of the laser with each scan removing about 112 nm of silicon. FIG. 2 shows the smooth profile of a 4 micron deep and 110 micron wide trench in silicon obtained using the same picoseconds laser beam with the UV wavelength. The smoothness of the profile should be noted. Such an ablation of silicon is used in all back-contact back-junction solar cells to form regions that isolate base regions from emitter regions. Use of a femtoseconds laser may provide further reduction of laser damage during silicon ablation.

The embodiments of this disclosure are also applicable to the ablation of amorphous silicon. A similar scheme may be used to ablate a desired thickness of amorphous silicon using a pulsed laser beam with femtoseconds pulse length and in some embodiments a UV or green wavelength. Since ablation of amorphous silicon requires much lower energy than crystalline silicon, such a scheme may effectively be used to selectively ablate amorphous silicon films from the crystalline silicon surface for application to hetero-junction solar cells.

This disclosure is also applicable to oxide ablation selective to the underlying substrate, crystalline or amorphous silicon. The oxide film is transparent to laser beams of wavelength down to UV. If a nanoseconds pulse length laser is used to remove the overlying oxide, the removal of oxide takes place by heating and melting of silicon underneath. Because of the pressure from the ablated silicon underneath, the overlying oxide is cracked and removed. This however, creates heavy damage in the silicon substrate so that a wet cleaning treatment is typically used to remove this damaged layer for use in high efficiency cells.

We present here a scheme where the oxide layer is selectively removed from the silicon surface without any appreciable damage to the silicon surface. During the laser ablation, besides heating the material to melt or evaporate it, other effects such as plasma formation take place. Sometimes complex processes can take place at an interface. Using a laser with picoseconds pulse length, the oxide to silicon interface is affected. Using a picoseconds laser with a UV wavelength, the interface effects are enhanced so that separation and delamination of the oxide film takes place from the silicon surface. The silicon surface left behind is virtually free of damage. Picoseconds laser radiation with green or infra-red (IR) wavelength can also be used depending on how much penetration damage of silicon substrate is acceptable. This disclosure will outline the procedure to obtain damage free selective ablation of oxide from the silicon surface.

FIGS. 3A-3D disclose the procedure for obtaining damage-free ablation of oxide. FIG. 3A shows the variation of laser spot opening in a 1000 Å PSG (phosphorus-doped oxide)/500 Å USG (undoped oxide) stack on a 35 micron thick epitaxial silicon film on a template, using a picoseconds UV laser beam. The oxide layers were deposited using APCVD (atmospheric-pressure CVD) technique. For a given thickness of oxide the spot size depends on the laser fluence ($J/cm^2$). The laser fluence is the laser pulse energy divided by the area of the laser beam. In this case, the laser beam was about 100 microns in diameter with a Gaussian profile ($M^2<1.3$). At very low fluence, the spots are irregular and there is irregular delamination of oxide from the silicon surface as shown in FIG. 3B, while at very high fluence there is extensive damage of silicon as shown in FIG. 3D. The range of fluence shown by line a-a' indicates the optimum range where the damage to the silicon substrate is minimal as seen in FIG. 3C.

FIG. 4 shows rows of cell contact openings that are selectively opened in the oxide for application in all back-contact (and back-junction) solar cells. FIG. 5 is a close-up of these contacts. The laser ablation spots can be overlapped in both x and y direction to open up an area of any desired length and width on the wafer as shown in FIGS. 6A and 6B. FIG. 6A shows a 180 micron wide opening made by selectively removing the BSG (boron-doped oxide) for base isolation region using picoseconds UV laser beam with ablation spots overlapping in both x and y-direction. Similarly, FIG. 6B shows a 90 micron wide area opened up in USG (undoped oxide) for forming the base region.

The selective ablation of oxide from a silicon surface as disclosed here can be used in solar cell making in several ways. In one application, when using in-situ emitter for back-contact cells, this process is used to open tracks in an oxide film to expose the underlying emitter. The emitter so exposed may be removed using wet etching. This region is then used for base to emitter isolation and with base formed inside it.

In another application, this process is used to open regions that are then used for making metal contacts. For front contacted cells, the oxide passivation can be used on the backside of the cells. The scheme described here is then used to open contacts for the metal that is subsequently deposited on these contacts. In this manner, the metal has localized contact that is conducive to high cell efficiency. For back contacted cells, contacts for both base and emitter may be opened using this scheme.

In a solar cell process flow, a doped oxide may need to be removed without causing any doping of the silicon underneath (i.e., without any appreciable heating of the doped oxide and silicon structure). Since, as described above, the oxide is removed by separation at the oxide/silicon substrate interface when using a picoseconds laser beam, the removal of oxide happens with limited pickup of the dopant from the oxide film being ablated.

The selective ablation of silicon nitride ($SiN_x$) is used for front contacted solar cells. Using laser ablation, the contact area to the emitter surface can be reduced thereby minimizing the area where the SiN passivation is removed. This leads to higher $V_{OC}$. Picosecond lasers with either UV or green wavelength are suitable for this application, although nanoseconds UV lasers can also be used.

Selective metal ablation from the oxide surface has historically been difficult using lasers. This is because at the high pulse energies needed to ablate metal, the energy is high enough to damage the oxide underneath and cause penetration of metal into oxide. In fact, this is the basis for the process of "laser fired contacts" (LFC) proposed for use in the solar cells.

We disclose three schemes for selectively removing metal from the oxide (or another dielectric) surface with no metal penetration of oxide (or other dielectrics such as silicon nitride) and breaking or cracking of oxide. In all these schemes, aluminum is the first metal in contact with base and emitter (aluminum being used as the contact and light trapping rear mirror layer). A laser with picoseconds pulse length is suitable for this application. For high metal removal rate the IR wavelength is quite suitable. According to the first scheme, metal is ablated at a pulse energy that is lower than the threshold for oxide ablation. If the thickness of metal removed in one scan is lower than the desired thickness, multiple overlapping scans are used to remove the full thickness of metal. Since the pulse energy is below the oxide ablation threshold, a clean removal of metal from the oxide surface is obtained. However, the exact recipe used highly depends on the type of metal in the stack, their thickness and surface roughness, etc.

Figure 7B:
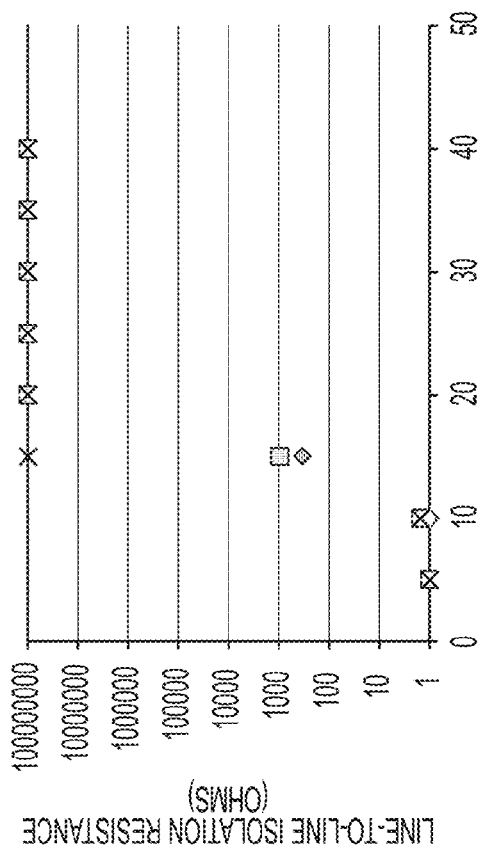
FIG. 7B shows that after 20 scans the metal runners are fully isolated.

FIGS. 7A-7C shows the ablation results when patterning a PVD-deposited bi-layer stack of 2400 A of NiV on 1200 A of Al on oxide. It is desired that the metal be removed completely between the runners without breaking through the oxide layer underneath (to prevent shunts in the cell). FIG. 7A shows the threshold for pulse energy, below which this metal stack can be removed without penetration of oxide. This threshold, besides depending on the metal stack characteristics described above, depends on the laser parameters such as spot overlap obtained using a certain pulse repetition rate of the laser as well as the scan speed. With increasing pulse overlap the threshold pulse energy would decrease, because of the energy accumulation in the metal. FIG. 7B shows that using a pulse energy below the threshold for oxide damage, more than twenty scans provided complete isolation of metal runners as determined by the 100M-ohm resistance between parallel lines. FIG. 7C shows a clean 75 micron trench formed in the 2400 A NiV/1200 Al metal stack.

According to the second, high-throughput scheme higher pulse energies are used, since a substantial part of the incident energy is absorbed as it is being ablated thereby preventing the damage to oxide. This approach makes the laser ablation of metal a very high throughput process. Using this scheme we have ablated 1250 A Al/100-250 A of NiV, with or without a tin (Sn) overlayer up to a thickness of 2500 A successfully using a two step process. In the first step the softer metal is removed using 15 microjoule pulses, followed by 30 microjoule pulses both overlapped fifteen times. For thicker aluminum such as 2000 A the second step can be carried out at 50 microjoules with the same number of overlapping of pulses.

The third scheme of metal ablation is applicable to highly reflective films, for example Al/Ag stack (with Al in contact with the cell and Ag on top of Al), such that most of the incident energy of the picoseconds laser is reflected and ablation is drastically reduced. In that case the surface of the reflective metal (Ag) is first dented using a long pulse length nanoseconds laser, pulse length from 10 to 800 nanoseconds, followed by picoseconds cleanup of the aluminum underneath.

This disclosure is also applicable to the selective doping of a substrate. For successful doping of silicon using an overlying layer of the dopant-containing material, the pulse energy should be high enough to melt the silicon but not high enough to ablate it or the dopant layer above it. As the silicon melts, the dopant is dissolved into it. Upon recrystallization of this silicon layer, a doped layer is obtained. For this application a nanoseconds pulse length laser with green wavelength is quite suitable because of its limited penetration into silicon.

The laser processing techniques described above are applicable to planar and 3-D thin-film crystalline silicon substrates. The laser processes described here are suitable for any thickness of the silicon substrate. These include the current standard wafer thickness of ≥150 microns used for crystalline silicon solar cells. However, they become even more advantageous for thin, fragile wafers or substrates as the process in carried out without any contact with the substrate. These include the wafers thinner than 150 micron obtained from monocrystalline CZ ingots or multi-crystalline bricks using advanced wire sawing techniques or by other techniques such as hydrogen implantation followed by annealing to separate the desired thickness of wafer, or thin-film monocrystalline substrates (such as in the thickness range of from a few microns up to 80 microns) obtained using epitaxial deposition of silicon on a sacrificial separation/release layer such as porous silicon and its subsequent lift off.

Figure 8B:
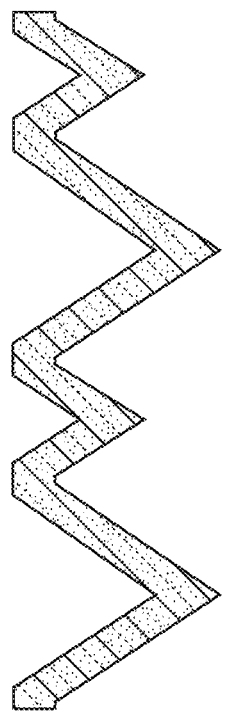
FIGS. 8A and 8B show a top view and a cross-sectional view of a pyramidal TFSC.
Figure 8A:
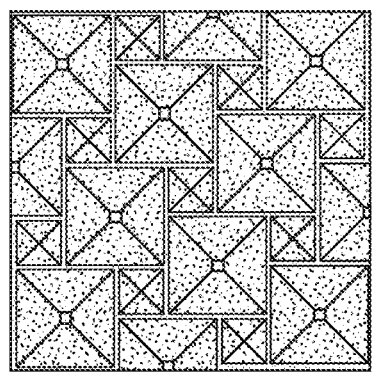
Figure 9B:
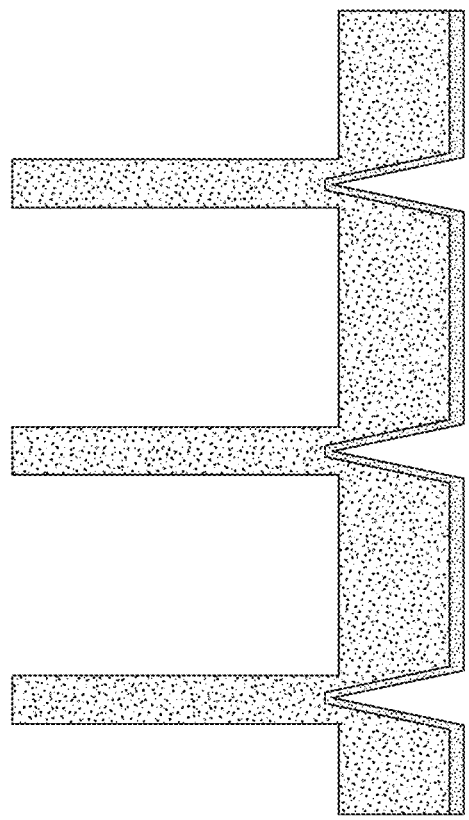
FIGS. 9A and 9B show a top view and a cross-sectional view of a prism TFSC.
Figure 9A:
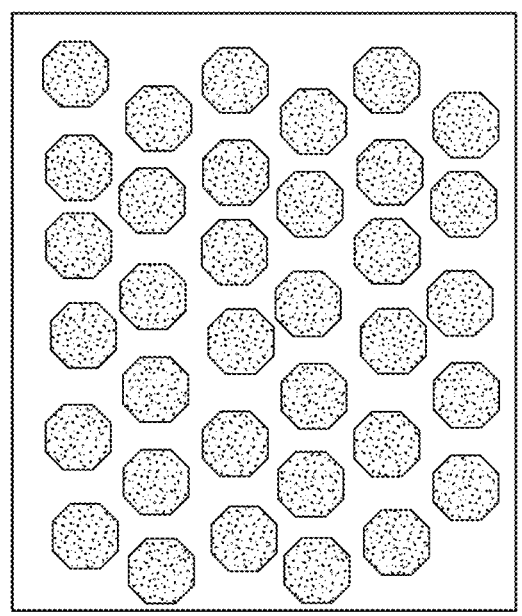
Figure 12B:
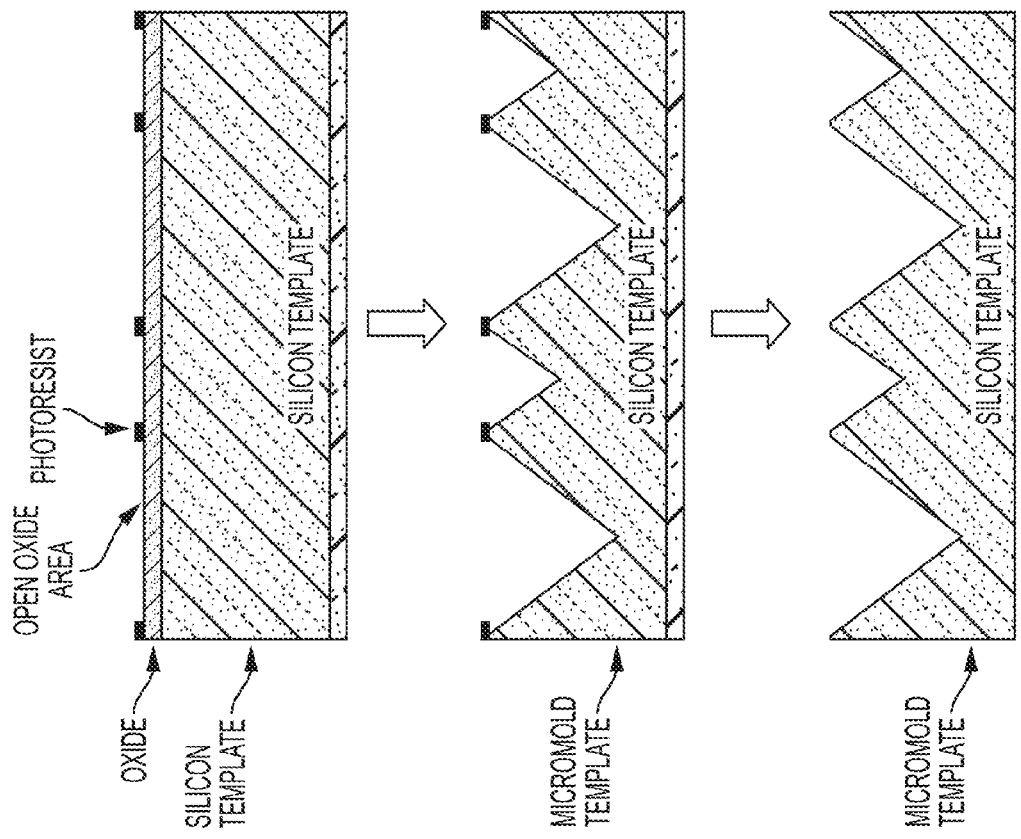
FIGS. 12A and 12B show a process flow for micromold template (or reusable template) creation for making a 3-D TFSS.
Figure 12A:
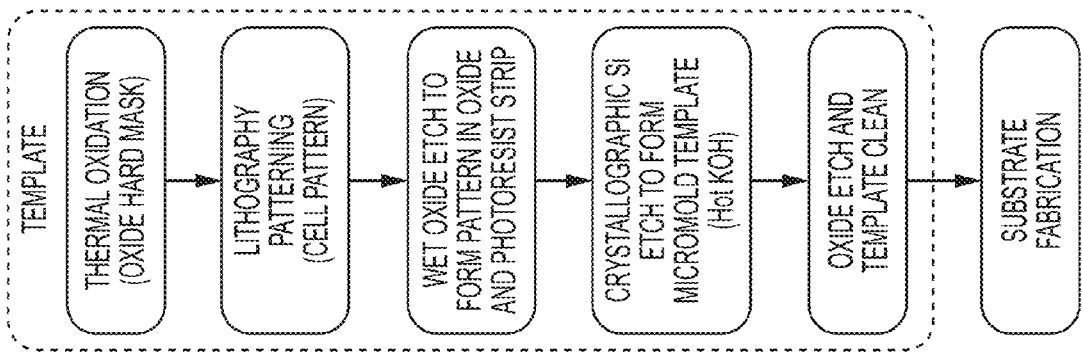

The laser processing is uniquely suited to three dimensional substrates obtained using pre-structuring of reusable templates and silicon micromachining techniques. One such method is described in the '713 application. FIGS. 8A through 9B show the 3-D thin film silicon substrates obtained using the technique described in that publication. FIG. 8A shows the top view while FIG. 8B shows the cross-section of the TFSS so obtained. For pyramidal substrates, the tips may be flat or may end in a sharp point. FIGS. 9A and 9B show the TFSS with prism structure obtained using a reusable pre-structured 3D template described in the reference above.

Although the laser processes and the process flows described here are applicable to any thickness of the silicon substrate (from less than one micron to over 100 microns), we disclose here their application to solar cells made using thin silicon substrates in the thickness range of from less than 1 micron to about 80 microns, including but not limited to those that are obtained using epitaxial silicon on porous silicon surface of a reusable template as described in the '713 application. To facilitate the understanding of our application, the process flow for obtaining a desired thickness (e.g. from about less than 10 microns up to about 120 microns) of planar monocrystalline TFSSs according to that publication is shown in FIGS. 10A and 10B for planar TFSS that are typically greater than about 50 microns so that they can be handled as self supporting substrates during cell processing, and FIGS. 11A and 11B for planar TFSS that is typically thinner than about 50 microns so that they are not self supporting during cell processing (and hence, are reinforced prior to separation from their host templates). FIGS. 12A-12D show the process flow for obtaining three-dimensional pyramidal silicon substrates. Three-dimensional prism-shaped substrates can be obtained with similar processes, but using a lithography or screen printed pattern that provides for that structure.

Figure 13:
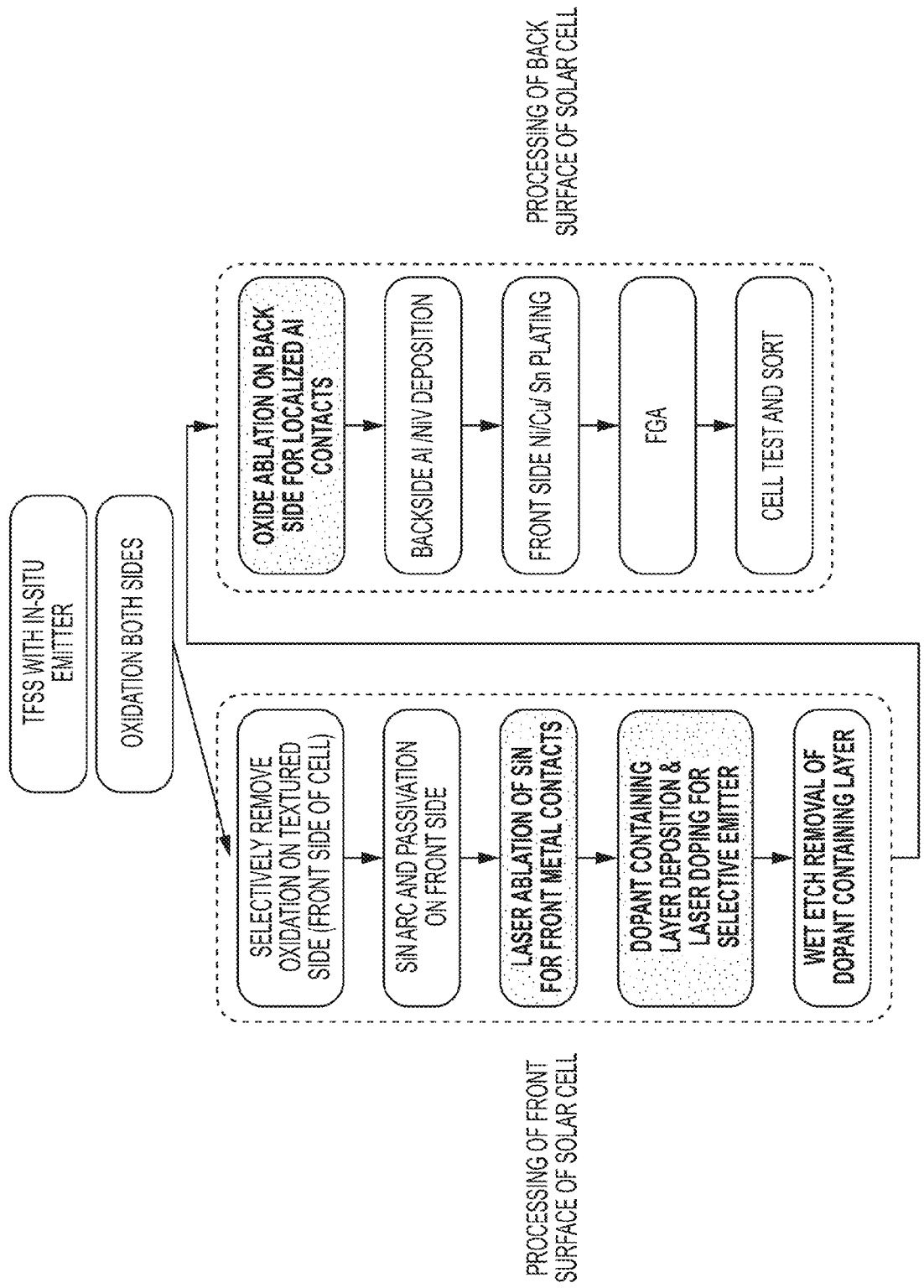
FIG. 13 shows a process flow for making a planar front contacted solar cell where the TFSS is thick enough to be free standing and self-supporting (e.g. thicker than approximately 50 microns for smaller 100 mm×100 mm substrates and thicker than approximately 80 microns for 156 mm×156 mm substrates), in accordance with the present disclosure.

The thin planar substrate obtained using the process flow of FIGS. 10A and 10B may be processed according to the process flow of FIG. 13 to obtain high efficiency front contacted solar cells. It should be noted for self-supporting TFSSs it is advantageous to process the template side of the TFSS first before proceeding to the other side. Since the template side of the TFSS is textured during the removal of the quasi-monocrystalline silicon remaining on the TFSS after its separation from the template it is preferably the frontside or sunnyside of the solar cell. The laser processes of selective ablation of silicon oxide and silicon nitride (SiN) are used to advantage in making this front contacted solar cell.

Figure 14:
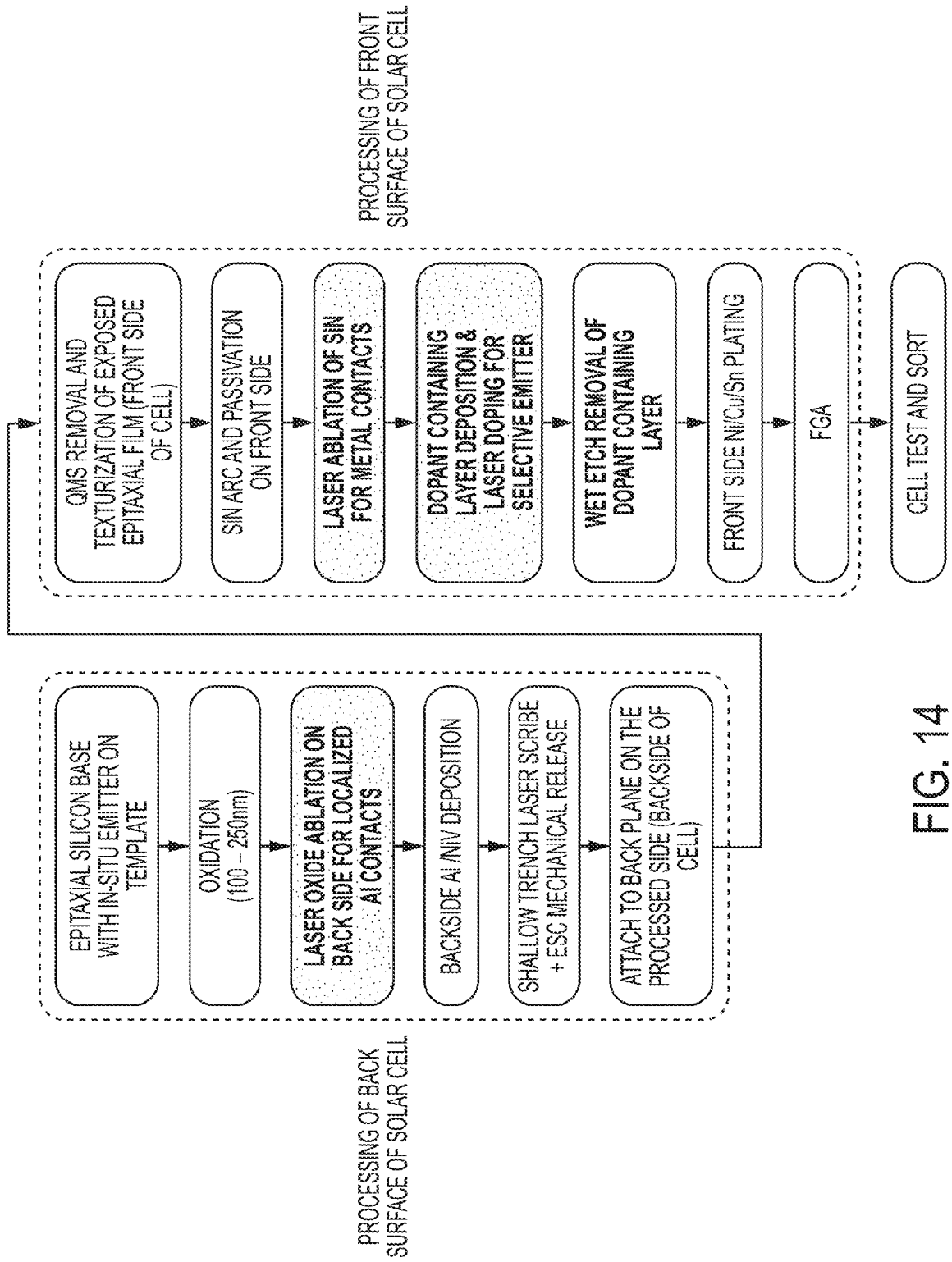
FIG. 14 shows a process flow for making a planar front contact solar cell where the TFSS is too thin to be self supporting, in accordance with the present disclosure.

FIG. 14 shows the application of various laser processes for making high efficiency front contacted solar cells using planar TFSSs where the TFSS is too thin to be free standing or self supporting during cell processing. It should be noted that in this case the non-template side surface is processed first with the TFSS on the template. Once this processing is complete the TFSS is first attached to a reinforcement plate or sheet (also called a backplane) on the exposed processed side and then separated from the template. After separation of the backplane-attached (or backplane-laminated) thin-film crystalline silicon solar cell, removal of residual porous silicon, texture etch, and SiN passivation/ARC deposition, and forming-gas anneal (FGA) operation processes are carried out on the released face of TFSS (which will end up being the front surface of the solar cell).

Figure 15:
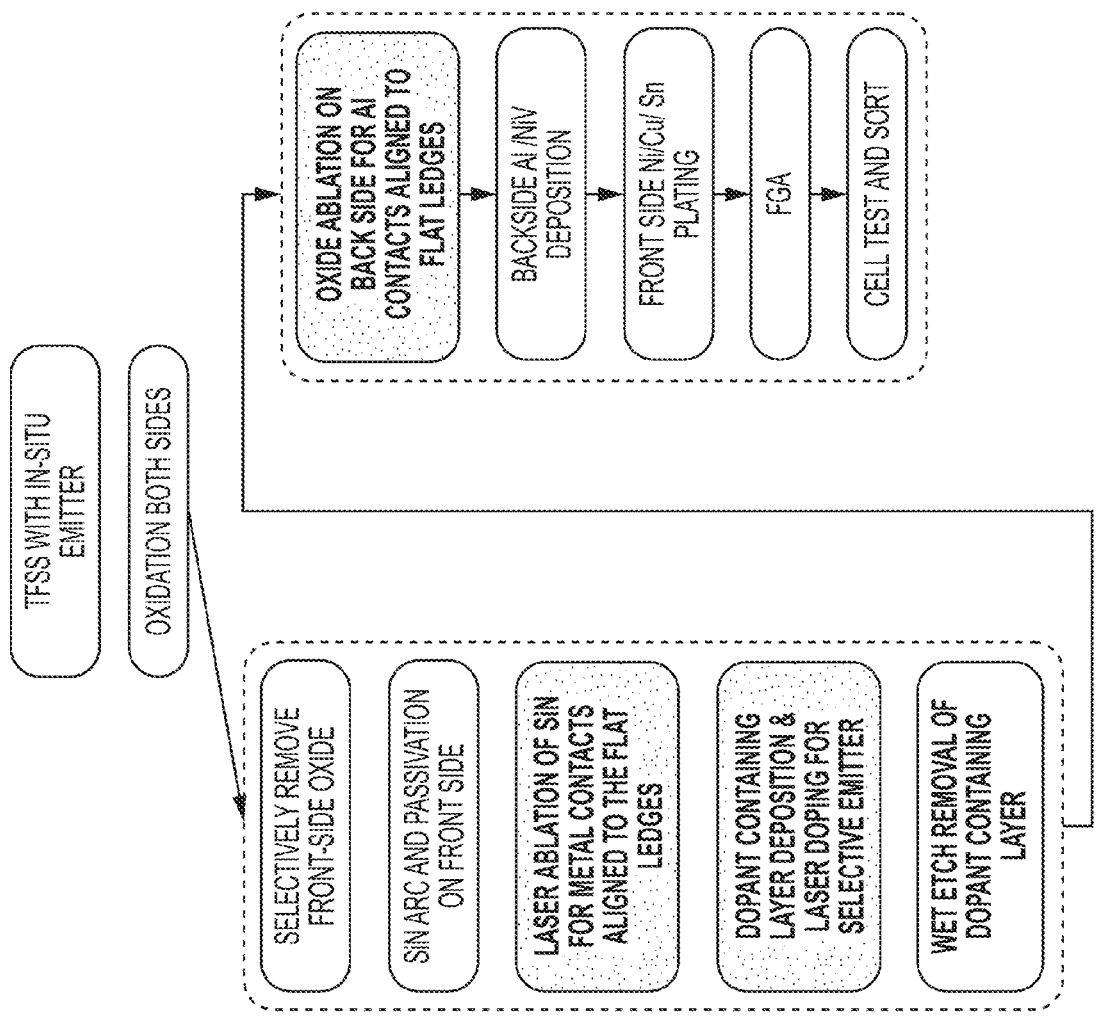
FIG. 15 shows a process flow for making a 3-D front contact solar cell in accordance with the present disclosure.
Figure 16B:
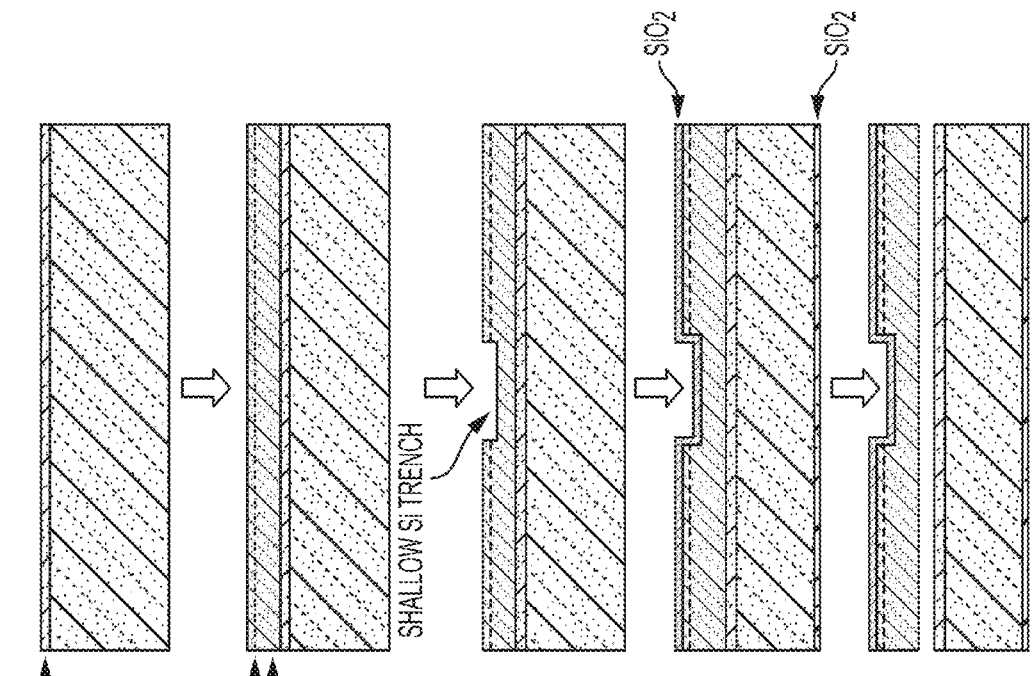
Figure 16A:
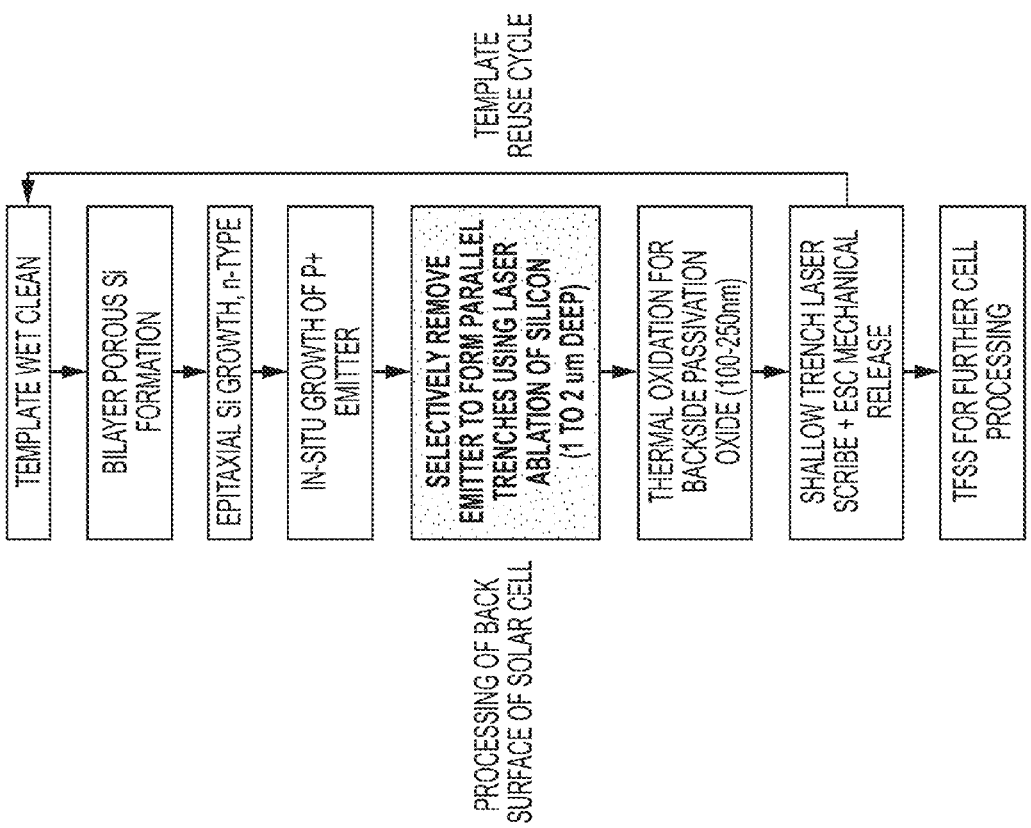

FIG. 15 shows the application of various laser processes for making high efficiency front contacted solar cells using 3-D front TFSS. For this application it is advantageous to have pyramid tips on the template side not be sharp but end in flat ledges.

The processes described here are further uniquely suited to simplifying the all back-contact cell process flow.

Figure 17:
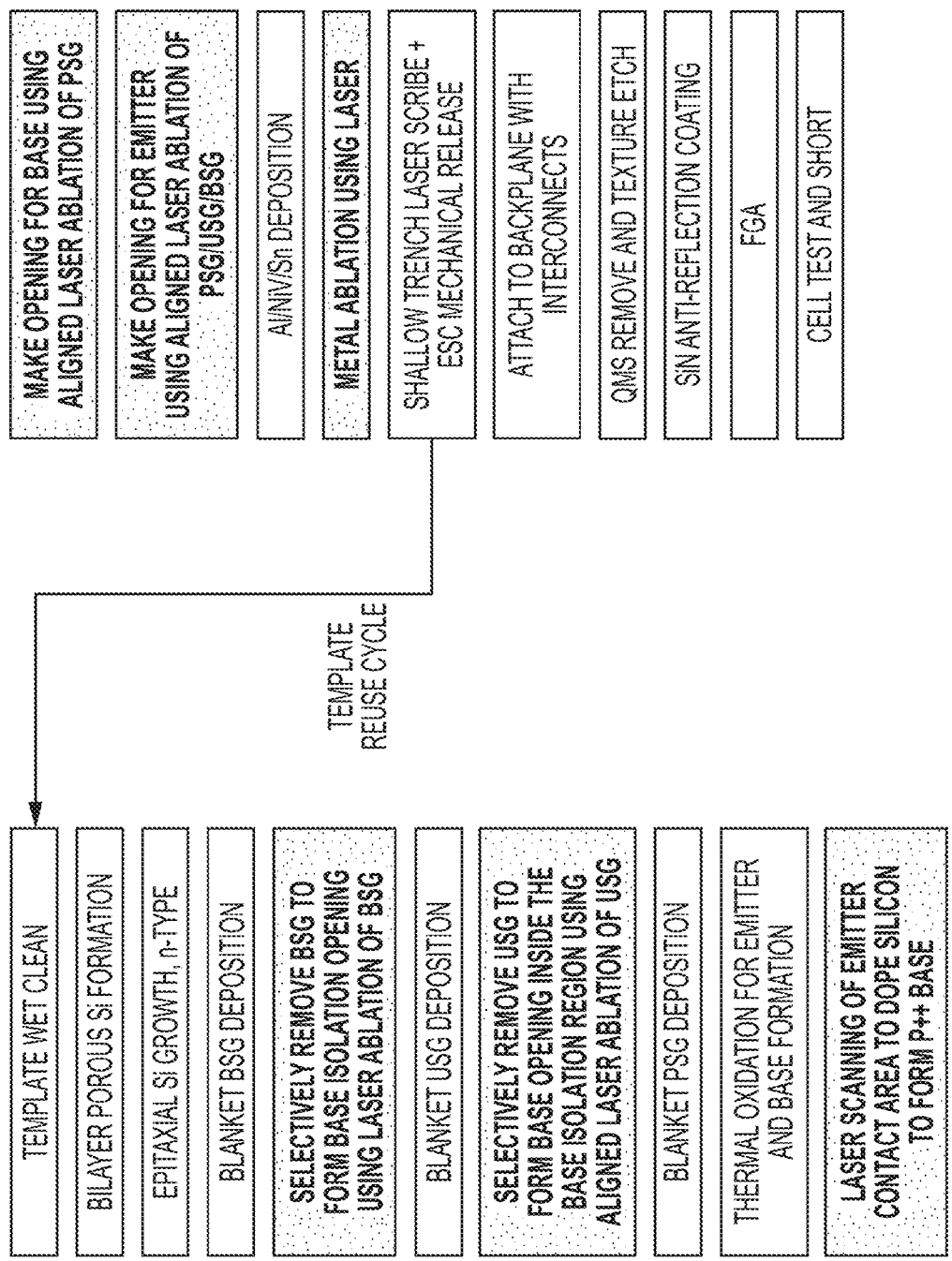
FIG. 17 shows a process flow for making an interdigitated back-contact back-junction solar cell using thick TFSS where the in-situ emitter is not deposited. Instead, a BSG (boron-doped oxide) layer is deposited on the epitaxial silicon film and patterned to open the base isolation region, in accordance with the present disclosure.

FIGS. 16A-16D show the laser processes used on the planar epitaxial substrate to make a back-contact/back-junction solar cell where the TFSS is self supporting (i.e., no backplane attachment to the cell). In this application the epitaxial emitter is deposited in-situ during silicon epitaxy following the deposition of the epitaxial silicon base. The ablation of silicon is then used to remove the emitter from the base isolation regions. At the same time four fiducials are etched into oxide to align subsequent ablation to this pattern. Next, a thermal oxide is grown to passivate the silicon surface that will become the back surface of the back-contact back-junction solar cell. The epitaxial silicon film is then disconnected or released from the template (by mechanical release from the porous silicon interface). Next, the residual porous silicon layer is wet etched and the surface is textured (both can be done using an alkaline etch process). This will become the textured front surface or the sunnyside of the solar cell. Now, the thermal oxide is ablated using a picoseconds UV laser to form base openings inside the base isolation region. The base opening is aligned inside the base isolation region (trench) formed by silicon ablation earlier using the fiducials that were etched in silicon earlier as mentioned above. Next a phosphorous containing oxide layer (PSG) is blanket deposited on the surface. Scanning with a nanosecond green or IR laser aligned to base opening using the fiducials in silicon causes the base to be doped. Also, the region that will have the contact openings to emitter is also doped in a similar manner using the aligned scans of nanosecond green or IR laser. Next, contact opening are made to these doped base and emitter areas using a picoseconds UV laser. Again, the alignment of these contact openings is made using fiducials in silicon. Now, a metal stack layer comprising aluminum as its first layer in contact with the cell (e.g., a stack of 1250 A Al/100-250 A NiV/2250 Sn) is deposited using a suitable method such as a PVD (physical vapor deposition) technique. Next, this layer is patterned using a picoseconds IR laser so that the metal runners are separately connected to the base and emitter regions. After an optional forming gas anneal (FGA), the cell is connected to and reinforced with a backplane with either embedded (Al or Cu) high-conductivity interconnects or no embedded interconnects (in the latter, the final cell metallization can be formed by a copper plating process). The cell is now ready for test and use. FIG. 17 shows the laser processes used on the planar epitaxial substrate to make a back-contact solar cell where epitaxial silicon base is not deposited with an emitter layer. Instead, a boron containing oxide (BSG) layer is deposited and patterned to open the base isolation region. A similar process to that described above is followed except that now the emitter and base are formed simultaneously during a thermal oxidation step according to the process flow outlined in FIG. 17.

Figure 18:
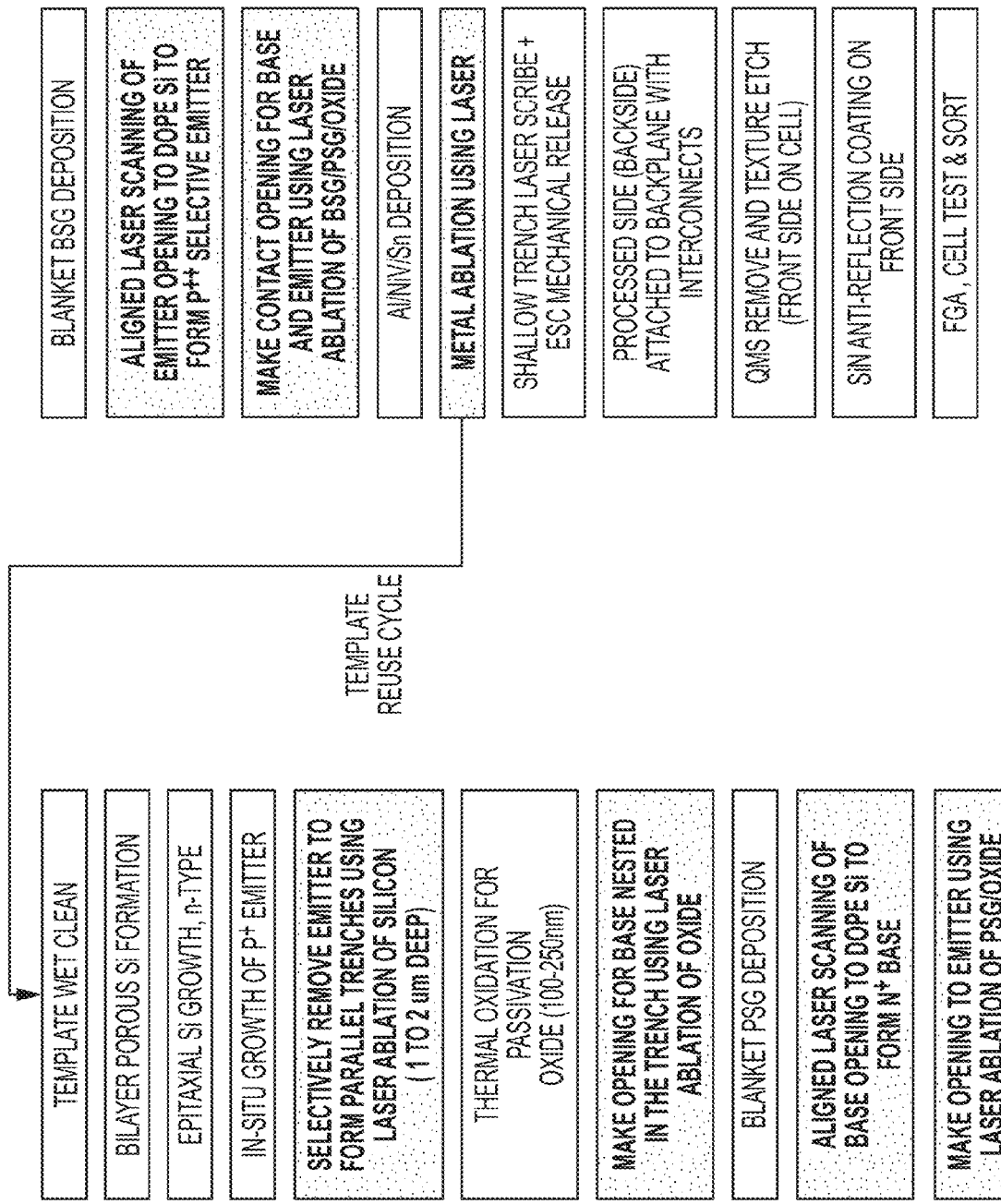
FIG. 18 shows a process flow for making an interdigitated back-contact back-junction solar cell where the TFSS is not thick enough to be self supporting, where in-situ emitter and laser ablation of silicon is used to form the base isolation opening, in accordance with the present disclosure.
Figures 19C, 19D:
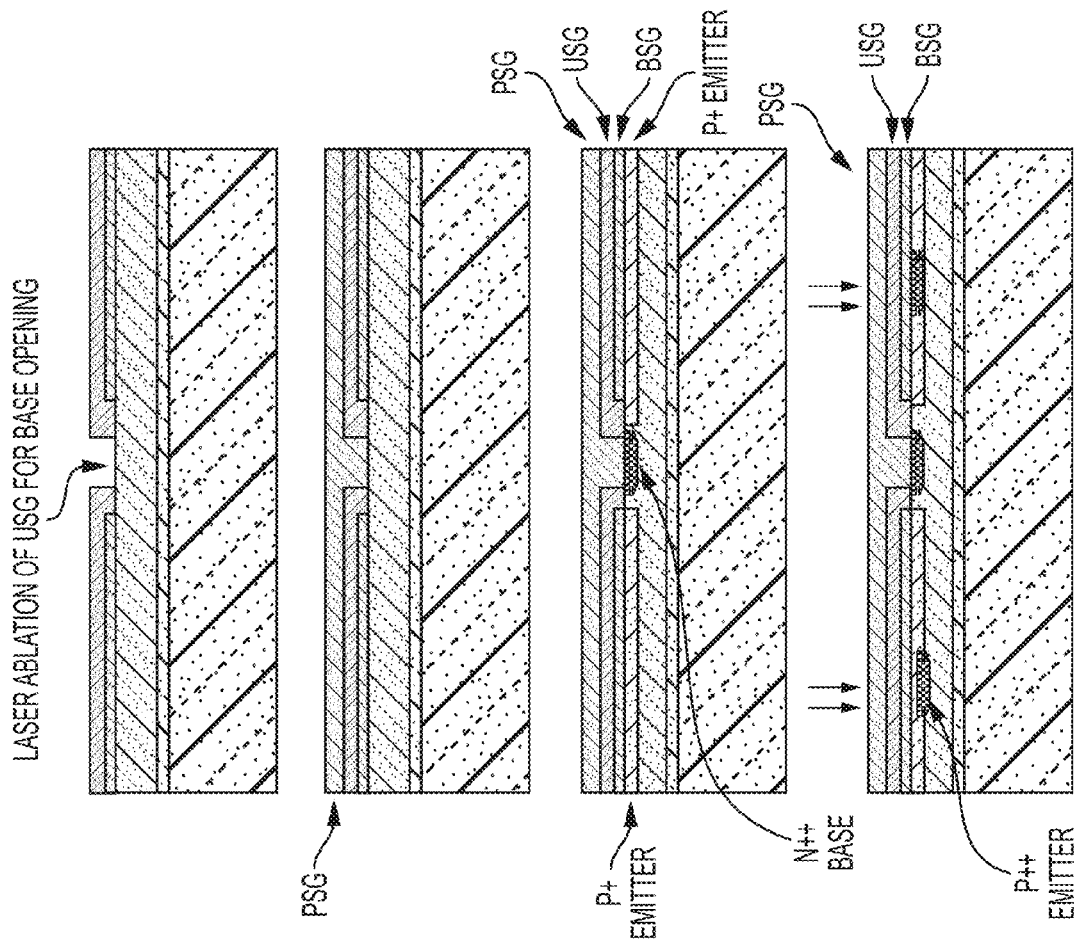

FIG. 18 shows a process flow using laser processes on the epitaxial substrate to make a planar back-contact/back-junction solar cell where the TFSS is not self-supporting (hence, a backplane is used). This flow uses the silicon ablation of in-situ doped emitter to form the base isolation region.

FIG. 19A-19H show a process flow using laser processes on the epitaxial substrate to make a planar back contact solar cell where the TFSS is not self-supporting. In this flow, instead of an in-situ emitter layer, the BSG deposition and selective laser ablation followed by thermal oxidation (or a thermal anneal or a thermal oxidizing anneal) is used to form the emitter as well as the base isolation region.

Figure 20:
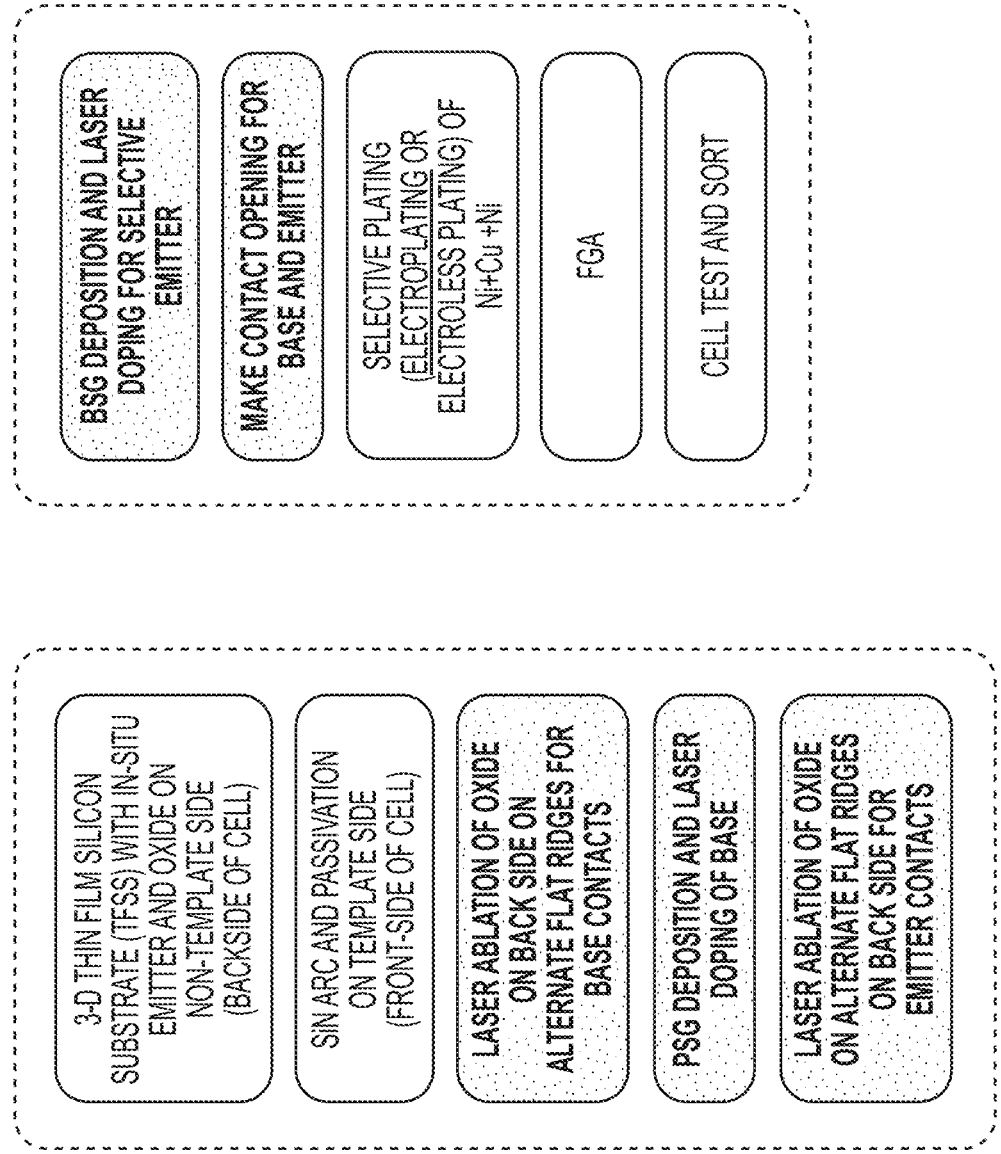
FIG. 20 shows a process flow for making an interdigitated back-contact back-junction solar cell using a 3-D TFSS, in accordance with the present disclosure.

FIG. 20 shows a process flow for making back contacted 3-D solar cells, it is advantageous to have the template side of pyramids end in relatively sharp points. Since the 3-D TFSS can be self-supporting to relatively low thickness (e.g., silicon as thin as about 25 microns), the process flow is similar to that shown in FIG. 16. It should be clear that we again have a choice of using the in-situ emitter followed by laser ablation of silicon, or BSG deposition and selective laser ablation followed by thermal oxidation (or thermal anneal, or thermal oxidizing anneal).

Figure 21:
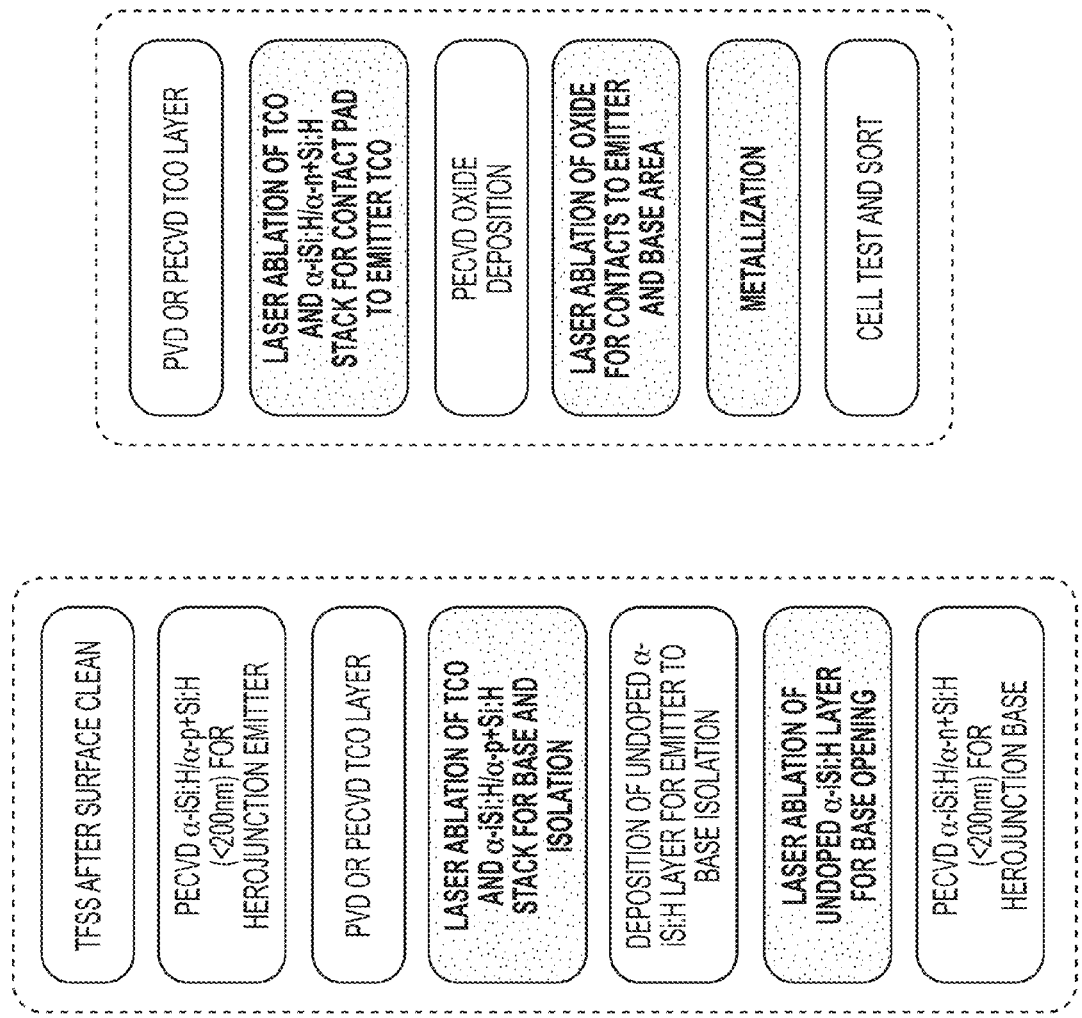
FIG. 21 shows a process flow for making an interdigitated back-contact back-junction hetero-junction solar cell, in accordance with the present disclosure.

For applications in hetero-junction solar cells, a hetero-junction emitter may be formed by a doped amorphous silicon layer in contact with an oppositely doped crystalline silicon base. For interdigitated back contact solar cells we pattern the amorphous silicon layer and the transparent conducting oxide (TCO) using laser ablation that is selective to the crystalline layer. Femtoseconds pulsewidth lasers with either UV or green wavelength are suitable for this application. A process flow is described in FIG. 21. Several variations of this process flow are possible.

Various embodiments and methods of this disclosure include at least the following aspects: the process to obtain damage-free silicon ablation of crystalline and amorphous silicon; the process to obtain oxide ablation for both doped and undoped oxides with no damage to silicon; the process to obtain fully isolated metal patterns on a dielectric surface for solar cell metallization; the process to selectively dope the emitter and base contact regions; the use of pulsed laser processing on very thin wafers, including planar and 3-D silicon substrate; the use of pulsed laser processing on substrates obtained using epitaxial deposition on a reusable template made using template pre-structuring techniques; the use of various pulsed laser processes in making front contacted homo-junction solar cells; the use of various pulsed laser processes in making all-back contacted homo-junction solar cells; and the use of various pulsed laser processes in making hetero-junction solar cells.

Although the front contact solar cells are described with p-type base and back-contact back-junction solar cells are described with n-type base, the laser processes described here are equally suited to the substrate with opposite doping, i.e., n-type for front contact solar cell with $P^+$ emitter, and p-type base for back-contact back-junction solar cells with p-type base and $n^+$ emitter.

Those with ordinary skill in the art will recognize that the disclosed embodiments have relevance to a wide variety of areas in addition to those specific examples described above.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A method for making a back contact solar cell, said method comprising the steps of:
    forming base isolation regions in a crystalline silicon back contact solar cell substrate having a substrate thickness in the range of approximately 1 micron to 100 microns;
    performing pulsed laser ablation of a substance on said crystalline silicon back contact solar cell substrate to form base openings, wherein said substance is at least one of silicon oxide, silicon nitride, aluminum oxide, silicon oxynitride, or silicon carbide;
    selectively doping emitter regions;
    selectively doping base regions;
    forming contact openings for said selectively doped base regions and said selectively doped emitter regions; and
    selectively forming metallization on said selectively doped base regions and said selectively doped emitter regions.

2. The method of claim 1, wherein said step of performing pulsed laser ablation is carried out using a picoseconds pulse UV laser.

3. The method of claim 1, wherein said step of forming base isolation regions in said crystalline silicon back contact solar cell substrate is carried out via a laser silicon ablation process and using a pulsed laser having a wavelength of approximately 800 nm or less and a pulse width less than approximately 100 picoseconds.

4. The method of claim 3, wherein said wavelength is approximately 355 nm or less.

5. The method of claim 4, wherein said pulse width is less than approximately 20 picoseconds.

6. The method of claim 1, wherein said step of forming base isolation regions in said crystalline silicon back contact solar cell substrate is carried out via pulsed laser ablation of a deposited borosilicate glass layer.

7. The method of claim 1, wherein said step of selectively doping emitter regions is performed via a laser doping process.

8. The method of claim 7, wherein said step of selectively doping emitter regions via a laser doping process is performed using a nanoseconds pulse green wavelength laser.

9. The method of claim 7, wherein said step of selectively doping emitter regions via a laser doping process is performed using a nanoseconds pulse IR wavelength laser.

10. The method of claim 1, wherein said step of selectively doping base regions is performed via a laser doping process.

11. The method of claim 10, wherein said step of selectively doping base regions via a laser doping process is performed using a nanoseconds pulse green wavelength laser.

12. The method of claim 10, wherein said step of selectively doping base regions via a laser doping process is performed using a nanoseconds pulse IR wavelength laser.

13. The method of claim 1, wherein said step of selectively doping emitter regions is performed via a laser doping process and step of selectively doping base regions is performed via a laser doping process.

14. The method of claim 1, wherein said step of forming contact openings for said selectively doped base regions and said selectively doped emitter regions is performed via laser ablation.

15. The method of claim 1, wherein said step of selectively forming metallization is performed using a physical vapor deposition process and a laser ablation patterning process.

16. The method of claim 1, wherein said substance is silicon oxide.

17. The method of claim 16, wherein said silicon oxide is thermal silicon oxide.

18. The method of claim 16, wherein said silicon oxide is deposited undoped silicate glass.

19. The method of claim 1, wherein said metallization is at least aluminum.

* * * * *